(12) United States Patent
Park et al.

(10) Patent No.: US 11,145,364 B2
(45) Date of Patent: Oct. 12, 2021

(54) NONVOLATILE MEMORY APPARATUS FOR MITIGATING READ DISTURBANCE AND SYSTEM USING THE SAME

(71) Applicant: SK hynix Inc., Icheon-si (KR)

(72) Inventors: Moo Hui Park, Icheon-si (KR); Seok Joon Kang, Seoul (KR); Jun Ho Cheon, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/738,945

(22) Filed: Jan. 9, 2020

(65) Prior Publication Data

US 2020/0402576 A1  Dec. 24, 2020

(30) Foreign Application Priority Data

Jun. 21, 2019  (KR) .................. 10-2019-0074175

(51) Int. Cl.
 *G11C 13/00* (2006.01)
(52) U.S. Cl.
 CPC ........ *G11C 13/0033* (2013.01); *G11C 13/003* (2013.01); *G11C 13/004* (2013.01); *G11C 13/0004* (2013.01); *G11C 13/0026* (2013.01); *G11C 13/0028* (2013.01)
(58) Field of Classification Search
 None
 See application file for complete search history.

(56) References Cited

U.S. PATENT DOCUMENTS

| | | | |
|---|---|---|---|
| 9,437,293 B1 | 9/2016 | Kripanidhi et al. | |
| 9,478,286 B1 | 10/2016 | Mantegazza et al. | |
| 10,032,508 B1 | 7/2018 | Srinivasan et al. | |
| 2013/0044539 A1* | 2/2013 | Hirst .................. | G11C 13/0059 365/163 |
| 2014/0362650 A1* | 12/2014 | Castro ................ | G11C 13/0028 365/189.011 |
| 2015/0348627 A1* | 12/2015 | Taub .................. | G11C 13/0069 365/163 |
| 2016/0351258 A1* | 12/2016 | Taub .................. | G11C 13/0028 |
| 2017/0076794 A1* | 3/2017 | Zeng .................. | G11C 13/0069 |
| 2019/0385644 A1* | 12/2019 | Kang .................... | G11C 5/147 |
| 2020/0066343 A1* | 2/2020 | Castro ................ | G11C 13/0069 |

FOREIGN PATENT DOCUMENTS

KR    1020200020316 A    2/2020

* cited by examiner

*Primary Examiner* — J. H. Hur
(74) *Attorney, Agent, or Firm* — William Park & Associates Ltd.

(57) ABSTRACT

A nonvolatile memory apparatus may include a memory cell, a bit line control circuit, and a word line control circuit. The memory cell may be coupled between a global bit line and a global word line. During a read operation, the bit line control circuit may provide a first high voltage to the global bit line and provide a second high voltage to the global bit line when snapback of the memory cell occurs. During the read operation, the word line control circuit may provide a second read supply voltage to the global word line and provide an anneal supply voltage to the global word line when snapback of the memory cell occurs.

19 Claims, 15 Drawing Sheets

NONVOLATILE MEMORY APPARATUS FOR MITIGATING READ DISTURBANCE AND SYSTEM USING THE SAME

CROSS-REFERENCES TO RELATED APPLICATION

The present application claims priority under 35 U.S.C. § 119(a) to Korean application number 10-2019-0074175, filed on Jun. 21, 2019, in the Korean Intellectual Property Office, which is incorporated herein by reference in its entirety.

BACKGROUND

1. Technical Field

Various embodiments generally relate to a memory apparatus, and more particularly, to a nonvolatile memory apparatus for mitigating read disturbance and a system using the same.

2. Related Art

An electronic device may include many electronic components. Among the electronic components, a computer system, for example, may include a large number of electronic components composed of semiconductors. The computer system may include a memory apparatus. Because a DRAM (Dynamic Random Access Memory) can store and output data at high and constant speed and perform random access, the DRAM is widely used as a general memory apparatus. However, because the DRAM includes memory cells each composed of a capacitor, the DRAM has a volatile characteristic of losing data stored therein when a power supply is removed. In order to remove such a disadvantage of the DRAM, a flash memory apparatus has been developed. The flash memory apparatus may include memory cells each composed of a floating gate, and thus have a nonvolatile characteristic of retaining data stored therein, even though power supply is removed. However, the flash memory apparatus stores and outputs data at lower speed than the DRAM, and thus has difficulties in performing random access.

Recently developed next-generation memory apparatuses have high operation speed and nonvolatile characteristics. Examples of the next-generation memory apparatuses may include a phase change RAM, a magnetic RAM, a resistive RAM and a ferroelectric RAM. The next-generation memory apparatuses can operate at high speed while having nonvolatile characteristics. In particular, the PRAM may include memory cells formed of chalcogenide, and store data by changing the resistance values of the memory cells.

SUMMARY

In an embodiment, a nonvolatile memory apparatus may include a memory cell, a bit line control circuit, a word line control circuit, and a sense amplifier. The memory cell may be coupled between a global bit line and a global word line. The bit line control circuit may be configured to provide one or more of a first high voltage and a second high voltage to the global bit line based on a read signal and a first control signal. The word line control circuit may be configured to provide one or more of a first low voltage and a second low voltage to the global word line based on the read signal and a second control signal, and to control one or more of a first current and a second current to flow through the global word line. The sense amplifier may be configured to sense snapback of the memory cell and generate the first and second control signals.

In an embodiment, an operation method of a nonvolatile memory apparatus may include selecting a bit line to couple a memory cell to a global bit line and selecting a word line to couple the memory cell to a global word line. The method may include applying a first high voltage to the global bit line and applying a first low voltage to the global word line, such that a first current flows through the memory cell; sensing whether snapback of the memory cell occurred. And the method may include applying a second high voltage to the global bit line and applying a second low voltage to the global word line, such that a second current flows through the memory cell, when the snapback of the memory cell occurred.

In an embodiment, a nonvolatile memory apparatus may include a memory cell, a bit line control circuit, a word line control circuit, and a sense amplifier. The memory cell may be coupled between a global bit line and a global word line. The bit line control circuit may be configured to provide one or more of a first high voltage and a second high voltage to the global bit line based on a read signal and a first control signal, and to control one or more of a first current and a second current to flow through the global bit line. The word line control circuit may be configured to provide one or more of a first low voltage and a second low voltage to the global word line based on the read signal and a second control signal. The sense amplifier may be configured to sense snapback of the memory cell and generate the first and second control signals.

DETAILED DESCRIPTION

Figure 1:
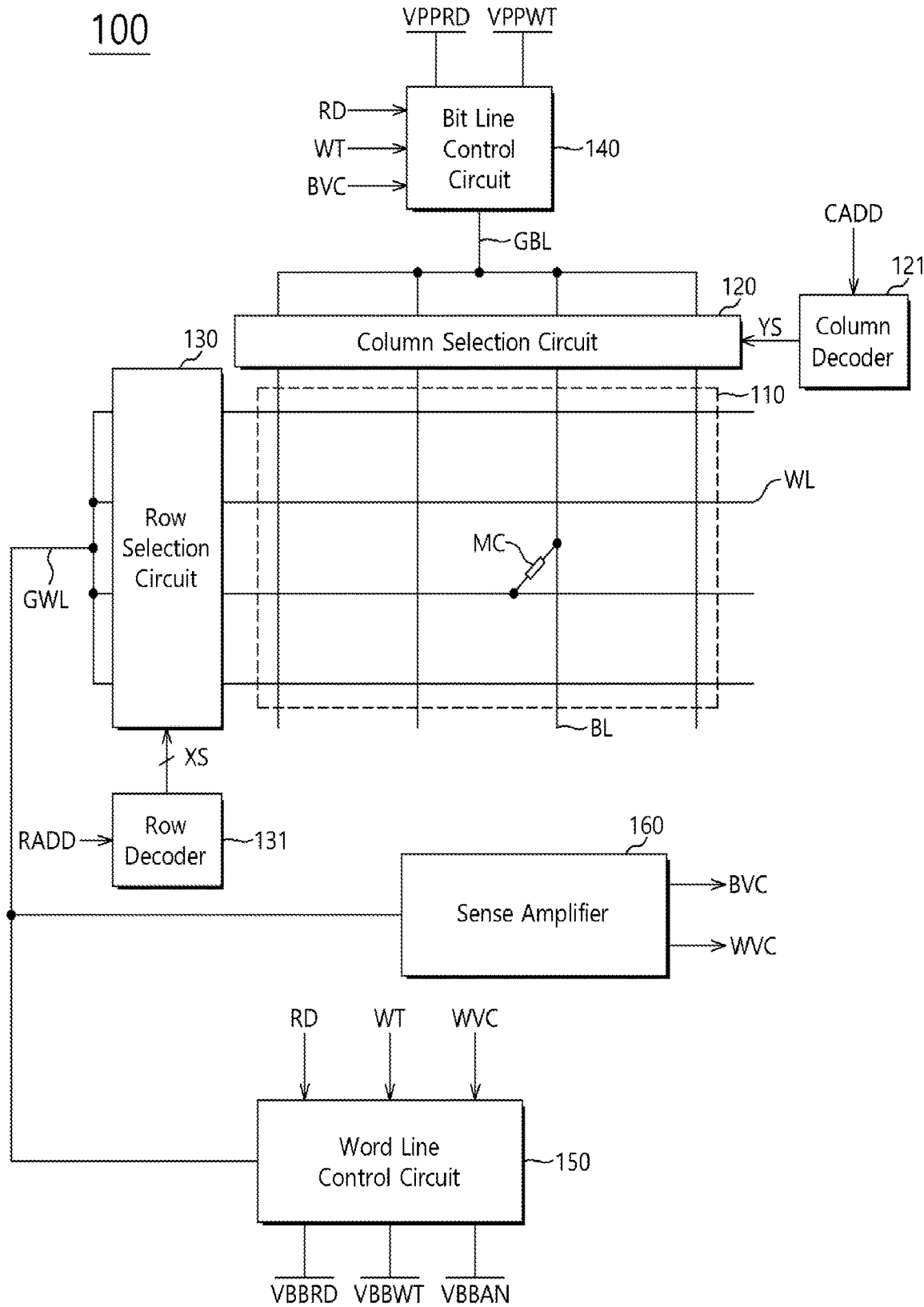
FIG. 1 is a diagram illustrating a configuration of a nonvolatile memory apparatus in accordance with an embodiment.

FIG. 1 is a diagram illustrating a configuration of a nonvolatile memory apparatus 100 in accordance with an embodiment. In FIG. 1, the nonvolatile memory apparatus 100 may include a memory array 110. The memory array 110 may include a plurality of bit lines BL arranged in a column direction and a plurality of word lines WL arranged in a row direction. A plurality of memory cells MC may be coupled to the respective intersections between the plurality of bit lines BL and the plurality of word lines WL. Each of the memory cells MC may be coupled between the bit line BL and the word line WL which correspond thereto. The memory cell MC may be configured as a variable resistance element, and include a phase change material, for example. The nonvolatile memory apparatus 100 may be a resistive memory apparatus or a phase change memory apparatus. The memory array 110 may be configured as a cross-point array.

The nonvolatile memory apparatus 100 may include a column selection circuit 120 and a row selection circuit 130. The column selection circuit 120 may be coupled between a global bit line GBL and the plurality of bit lines BL. The column selection circuit 120 may couple a bit line selected among the plurality of bit lines BL to the global bit line GBL. The column selection circuit 120 may select a specific bit line among the plurality of bit lines BL based on a column selection signal YS which may be generated based on a column address signal CADD, and couple the selected bit line to the global bit line GBL. The row selection circuit 130 may be coupled between a global word line GWL and the plurality of word lines WL. The row selection circuit 130 may couple a word line selected among the plurality of word lines WL to the global word line GWL. The row selection circuit 130 may select a specific word line among the plurality of word lines WL based on a row selection signal XS which may be generated based on a row address signal RADD, and couple the selected word line to the global word line GWL. The row selection circuit 130 may lower the voltage level of the row selection signal XS, and select a word line based on the row selection signal XS having the lowered voltage level.

The nonvolatile memory apparatus 100 may further include a column decoder 121 and a row decoder 131. The column decoder 121 may generate the column selection signal YS based on the column address signal CADD. The column decoder 121 may decode the column address signal CADD and generate the column selection signal YS for the column selection circuit 120 to select a specific bit line. The row decoder 131 may generate the row selection signal XS based on the row address signal RADD. The row decoder 131 may decode the row address signal RADD and generate the row selection signal XS for the row selection circuit 130 to select a specific word line.

The nonvolatile memory apparatus 100 may include a bit line control circuit 140, a word line control circuit 150 and a sense amplifier 160. The bit line control circuit 140 may be coupled to the global bit line GBL. The bit line control circuit 140 may change the voltage level of the global bit line GBL for read and write operations of the nonvolatile memory apparatus 100. The bit line control circuit 140 may receive a read signal RD, a write signal WT and a first control signal BVC, and drive the global bit line GBL with one or more voltages.

The read signal RD may be enabled when the nonvolatile memory apparatus 100 performs a read operation. The read operation may indicate an operation in which the nonvolatile memory apparatus 100 reads data stored in the memory array 110 and outputs the read data to an external device of the nonvolatile memory apparatus 100. The write signal WT may be enabled when the nonvolatile memory apparatus 100 performs a write operation. The write operation may indicate an operation in which the nonvolatile memory apparatus 100 stores or programs data received from the external device into the memory array 110. The write operation may include a reset write operation and a set write operation. The write signal WT may include a reset write signal and a set write signal. The memory cell MC may be programmed into a low or high resistance state to store data. In an embodiment, the memory cell MC may have a plurality of low resistance states and a plurality of high resistance states, and store multi-bit data. The reset write signal may indicate a signal for programming the memory cell MC into the high resistance state, and the set write signal may indicate a signal for programming the memory cell MC into the low resistance state. The first control signal BVC may be generated through the sense amplifier 160 which will be described below.

The bit line control circuit 140 may provide one or more voltages to the global bit line GBL based on the read signal RD or the write signal WT. For example, the bit line control circuit 140 may receive a first read supply voltage VPPRD, and provide a first high voltage to the global bit line GBL based on the read signal RD during the read operation. The bit line control circuit 140 may apply a first write supply voltage VPPWT to the global bit line GBL based on the write signal WT during the write operation. The first write supply voltage VPPWT may have a higher voltage level than the first read supply voltage VPPRD. The first high voltage may have a lower voltage level than the first read supply voltage VPPRD. Although described below, the voltage level of the first high voltage may be set to a voltage level for applying a voltage corresponding to a read voltage across the memory cell MC, and the voltage level of the first write supply voltage VPPWT may be set to a voltage level for applying a voltage corresponding to a write voltage across the memory cell MC. The read voltage may have a suitable voltage level capable of determining the resistance state of a memory cell. For example, the voltage level of the read voltage may be higher than the maximum threshold voltage of memory cell distribution in the low resistance state, and lower than the minimum threshold voltage of memory cell distribution in the high resistance state.

The bit line control circuit 140 may increase the voltage level of the global bit line GBL based on the first control signal BVC. For example, when the first control signal BVC is enabled, the bit line control circuit 140 may provide the global bit line GBL with a second high voltage having a higher voltage level than the first high voltage. For example, the second high voltage may have a voltage level equal to or lower than the first read supply voltage VPPRD.

The word line control circuit 150 may be coupled to the global word line GWL. The word line control circuit 150 may change the voltage level of the global word line GWL for read and write operations of the nonvolatile memory apparatus 100. The word line control circuit 150 may receive the read signal RD, the write signal WT and a second control signal WVC, and provide one or more voltages to the global word line GWL. The word line control circuit 150 may change a current flowing through the memory cell MC by changing a current flowing through the global word line GWL, based on the read signal RD and the second control signal WVC.

The word line control circuit 150 may provide one or more voltages to the global word line GWL based on the read signal RD and the write signal WT. For example, the word line control circuit 150 may receive a second read supply voltage VBBRD as a supply voltage for the read operation, and apply the second read supply voltage VBBRD to the global word line GWL based on the read signal RD during the read operation. The second read supply voltage VBBRD may have a lower voltage level than the first high voltage. For example, the second read supply voltage VBBRD may be a ground voltage or a negative voltage having a voltage level equal to or lower than the ground voltage. The word line control circuit 150 may receive a second write supply voltage VBBWT, and apply the second write supply voltage VBBWT to the global word line GWL based on the write signal WT. The second write supply voltage VBBWT may have a voltage level equal to or lower than the second read supply voltage VBBRD. The second read supply voltage VBBRD may be set to such a voltage level that a voltage level difference between the first high voltage and the second read supply voltage VBBRD corresponds to the voltage level of the read voltage. The second write supply voltage VBBWT may be set to such a voltage level that a voltage level difference between the first write supply voltage VPPWT and the second write supply voltage VBBWT corresponds to the voltage level of the write voltage. The word line control circuit 150 may provide an anneal low voltage VBBAN to the global word line GWL based on the second control signal WVC. The anneal low voltage VBBAN may have a lower voltage level than the second read supply voltage VBBRD. The anneal low voltage VBBAN may be set to such a voltage level that a voltage level difference between the second high voltage and the anneal low voltage VBBAN corresponds to the voltage level of a voltage which can anneal and/or set back the memory cell MC.

The word line control circuit 150 may control a first current to flow through the global word line GWL based on the read signal RD. The word line control circuit 150 may control a second current to flow through the global word line GWL based on the second control signal WVC. The second current may have a larger amount than the first current. The second current may be an anneal current and/or set-back current for retaining and/or setting the memory cell MC in the low resistance state.

The sense amplifier 160 may be coupled to the global word line GWL. The sense amplifier 160 may sense snapback of the memory cell MC. The sense amplifier 160 may generate the first control signal BVC and the second control signal WVC by sensing snapback of the memory cell MC. The sense amplifier 160 may sense the voltage level of the global word line GWL and determine whether snapback of the memory cell MC occurred. The sense amplifier 160 may generate the first control signal BVC and the second control signal WVC based on whether snapback of the memory cell MC occurs during the read operation. For example, the sense amplifier 160 may retain the first and second control signals BVC and WVC in a disabled state, when snapback of the memory cell MC did not occur. The sense amplifier 160 may enable the first and second control signals BVC and WVC, when snapback of the memory cell MC occurred.

Figure 2A:
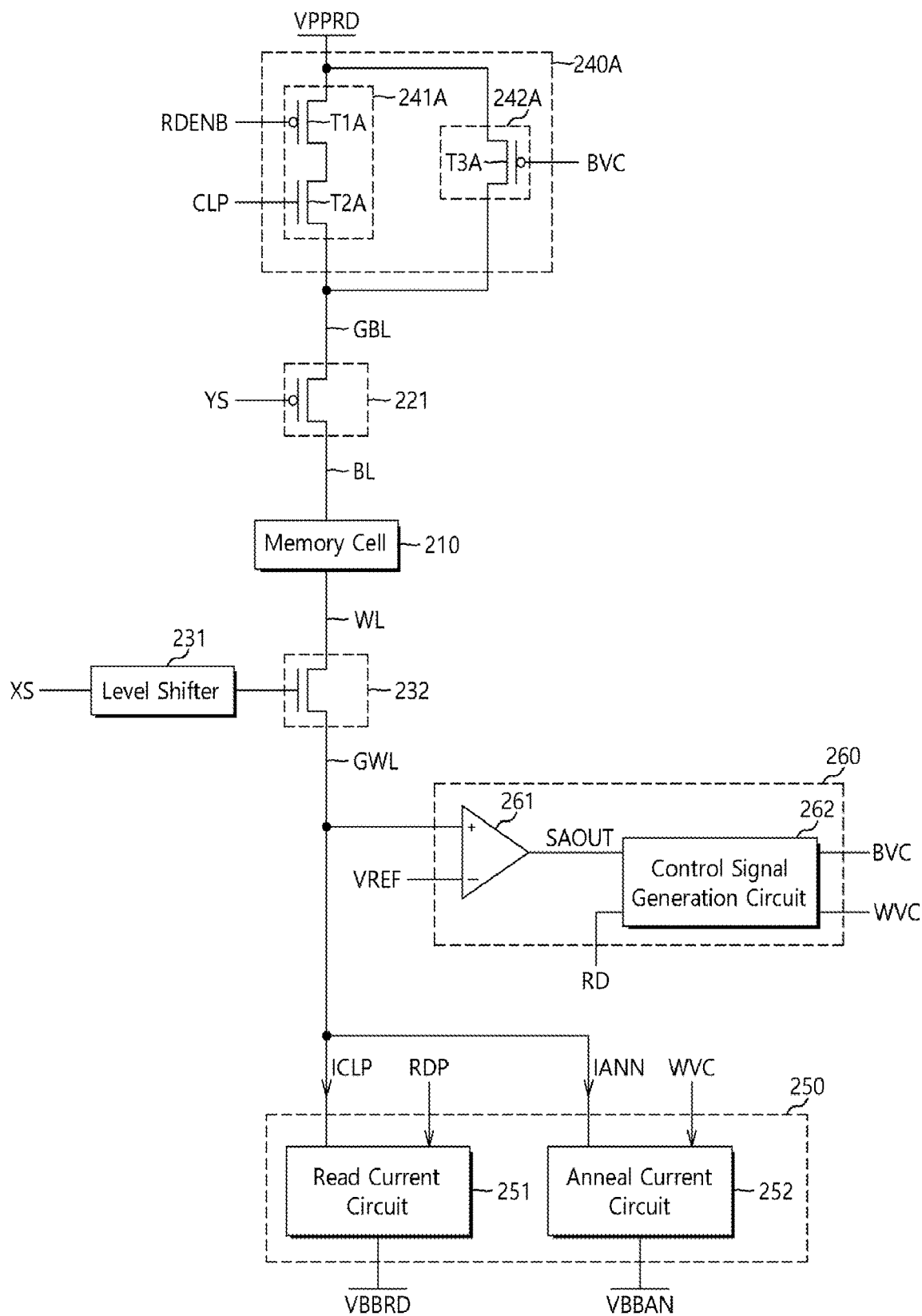
FIG. 2A is a diagram illustrating a configuration of a nonvolatile memory apparatus in accordance with an embodiment.

FIG. 2A is a diagram illustrating a configuration of a nonvolatile memory apparatus 200A in accordance with an embodiment. For clear description, FIG. 2A illustrates components of the nonvolatile memory apparatus, which can be coupled to one memory cell. Furthermore, FIG. 2A illustrates components of the nonvolatile memory apparatus for a read operation. The nonvolatile memory apparatus 200A may be applied as the nonvolatile memory apparatus 100 illustrated in FIG. 1. The nonvolatile memory apparatus 200A may include a memory cell 210, and the memory cell 210 may have one end coupled to a bit line BL and the other end coupled to a word line WL. The bit line BL may be coupled to the global bit line GBL, and the word line WL may be coupled to the global word line GWL.

The nonvolatile memory apparatus 200A may include a bit line control circuit 240A, a word line control circuit 250 and a sense amplifier 260. The bit line control circuit 240A may provide one of first and second high voltages to the global bit line GBL, based on the read signal RD and the first control signal BVC. The bit line control circuit 240A may receive the first read supply voltage VPPRD, and generate the first and second high voltages from the first read supply voltage VPPRD. The bit line control circuit 240A may provide the first high voltage to the global bit line GBL based on the read signal RD, and provide the second high voltage to the global bit line GBL based on the first control signal BVC. The second high voltage may have a higher voltage level than the first high voltage.

The bit line control circuit 240A may include a read voltage supply circuit 241A and a bypass circuit 242A. The read voltage supply circuit 241A may receive the first read supply voltage VPPRD, and provide the first high voltage to the global bit line GBL based on the read signal RD. The read voltage supply circuit 241A may provide the first high voltage to the global bit line GBL based on a read enable signal RDENB and a clamp signal CLP. The read enable signal RDENB may be generated based on the read signal RD during the read operation of the nonvolatile memory apparatus 200A. The clamp signal CLP may be a bias voltage having a voltage level corresponding to a logic high level, for example. The read voltage supply circuit 241A may clamp the first read supply voltage VPPRD based on the read enable signal RDENB and the clamp signal CLP, and provide the global bit line GBL with the first high voltage having a lower voltage level than the first read supply voltage VPPRD.

The bypass circuit 242A may receive the first read supply voltage VPPRD and the first control signal BVC. The bypass circuit 242A may provide the second high voltage to the global bit line GBL based on the first control signal BVC. The second high voltage may have a voltage level equal to or lower than the first read supply voltage VPPRD and higher than the first high voltage. The bypass circuit 242A may raise the voltage level of the global bit line GBL based on the first control signal BVC. When the first control signal BVC is enabled, the bypass circuit 242A may raise the voltage of the global bit line GBL from the first high voltage to the second high voltage.

The read voltage supply circuit 241A may include a first transistor T1A and a second transistor T2A. The first transistor T1A may be a P-channel MOS transistor, and the second transistor T2A may be an N-channel MOS transistor. The first transistor T1A may have a gate configured to receive the read enable signal RDENB and a source configured to receive the first read supply voltage VPPRD. The second transistor T2A may have a gate configured to receive the clamp signal CLP, a drain coupled to a drain of the first transistor T1A, and a source coupled to the global bit line GBL. When the read enable signal RDENB is enabled to a low level, the first transistor T1A may provide the first read supply voltage VPPRD to the drain of the second transistor T2A. The second transistor T2A may clamp the voltage level of the first read supply voltage VPPRD based on the clamp signal CLP, and provide the clamped voltage as the first high voltage to the global bit line GBL. For example, the first high voltage may have a voltage level VPPRD−VthT2A corresponding to a voltage level obtained by subtracting the threshold voltage VthT2A of the second transistor T2A from the first read supply voltage VPPRD.

The bypass circuit 242A may include a third transistor T3A. The third transistor T3A may include a P-channel MOS transistor. The third transistor T3A may have a gate configured to receive the first control signal BVC, a source configured to receive the first read supply voltage VPPRD, and a drain coupled to the global bit line GBL. When the first control signal BVC is enabled, the third transistor T3A may provide a voltage, which has substantially the same voltage level as the first read supply voltage VPPRD, as the second high voltage to the global bit line GBL.

The word line control circuit 250 may provide one of first and second low voltages to the global word line GWL, based on the read signal RD and the second control signal WVC. The second low voltage may have a lower voltage level than the first low voltage. The first low voltage may correspond to the second read supply voltage VBBRD, and the second low voltage may correspond to the anneal low voltage VBBAN. The anneal low voltage VBBAN may have a lower voltage level than the second read supply voltage VBBRD. When a read pulse signal RDP is enabled, the word line control circuit 250 may provide the second read supply voltage VBBRD as the first low voltage to the global word line GWL. When the second control signal WVC is enabled, the word line control circuit 250 may provide the anneal low voltage VBBAN as the second low voltage to the global word line GWL to lower the voltage level of the global word line GWL. The read pulse signal RDP, which is a signal generated based on the read signal RD, may be enabled when the read signal RD is enabled. The read pulse signal RDP may have a shorter enable interval than that of the read signal RD. The read pulse signal RDP may be enabled during a time which is typically required for determining the resistance state of the memory cell 210 when snapback of the memory cell 210 occurs after the read voltage is applied across the memory cell 210.

The word line control circuit 250 may control one of first and second currents ICLP and IANN to flow through the global word line GWL, based on the read signal RD and the second control signal WVC. The word line control circuit 250 may control the first current ICLP to flow through the global word line GWL based on the read pulse signal RDP, and control the second current IANN to flow through the global word line GWL based on the second control signal WVC. The first current ICLP may correspond to a clamping current flowing through the memory cell 210 for a read operation on the memory cell 210. The second current IANN may correspond to an anneal current that anneals and/or sets back the memory cell 210 to retain the memory cell 210 in a low resistance state. The second current IANN may be larger than the first current ICLP.

The word line control circuit 250 may include a read current circuit 251 and an anneal current circuit 252. The read current circuit 251 may receive the second read supply voltage VBBRD, provide the second read supply voltage VBBRD to the global word line GWL based on the read pulse signal RDP, and control the first current ICLP to flow through the global word line GWL. The anneal current circuit 252 may receive the anneal low voltage VBBAN, provide the anneal low voltage VBBAN to the global word line GWL based on the second control signal WVC, and control the second current IANN to flow through the global word line GWL. Therefore, the anneal current circuit 252 may lower the voltage level of the global word line GWL and increase the current flowing through the global word line GWL, based on the second control signal WVC.

The sense amplifier 260 may be coupled to the global word line GWL. The sense amplifier 260 may receive a reference voltage VREF. The reference voltage VREF may have a suitable voltage level capable of sensing a change in voltage level of the global word line GWL, when snapback of the memory cell occurred. The sense amplifier 260 may generate an output signal SAOUT by comparing the voltage level of the global word line GWL to the voltage level of the reference voltage VREF. The sense amplifier 260 may include a comparator 261 which compares and amplifies the voltage levels of the global word line GWL and the reference voltage VREF. For example, when the voltage level of the global word line GWL is higher than the voltage level of the reference voltage VREF, the sense amplifier 260 may change the output signal SAOUT from a low level to a high level. The sense amplifier 260 may generate the first control signal BVC which is enabled to a low level when the output signal SAOUT transitions to a high level. The sense amplifier 260 may further include a control signal generation circuit 262. The control signal generation circuit 262 may generate the first and second control signals BVC and WVC based on the output signal SAOUT and the read signal RD. The control signal generation circuit 262 may generate the first control signal BVC which is enabled to a low level when the output signal SAOUT transitions to a high level, and the second control signal WVC which is enabled to a high level when the output signal SAOUT transitions to a high level. The control signal generation circuit 262 may disable the first and second control signals BVC and WVC when the read signal RD is disabled.

In FIG. 2A, the nonvolatile memory apparatus 200A may further include a column selection switch 221, a level shifter 231 and a row selection switch 232. The column selection switch 221 may be a component of the column selection circuit 120 illustrated in FIG. 1, and the level shifter 231 and the row selection switch 232 may be components of the row selection circuit 130 illustrated in FIG. 1. The column selection switch 221 may couple the bit line BL to the global bit line GBL based on the column selection signal YS, such that the memory cell 210 can be coupled to the global bit line GBL. The level shifter 231 may receive the row selection signal XS. The level shifter 231 may drop the voltage level of the row selection signal XS. The row selection switch 232 may receive an output of the level shifter 231 and couple the word line WL to the global word line GWL such that the memory cell 210 can be coupled to the global word line GWL.

Figure 2B:
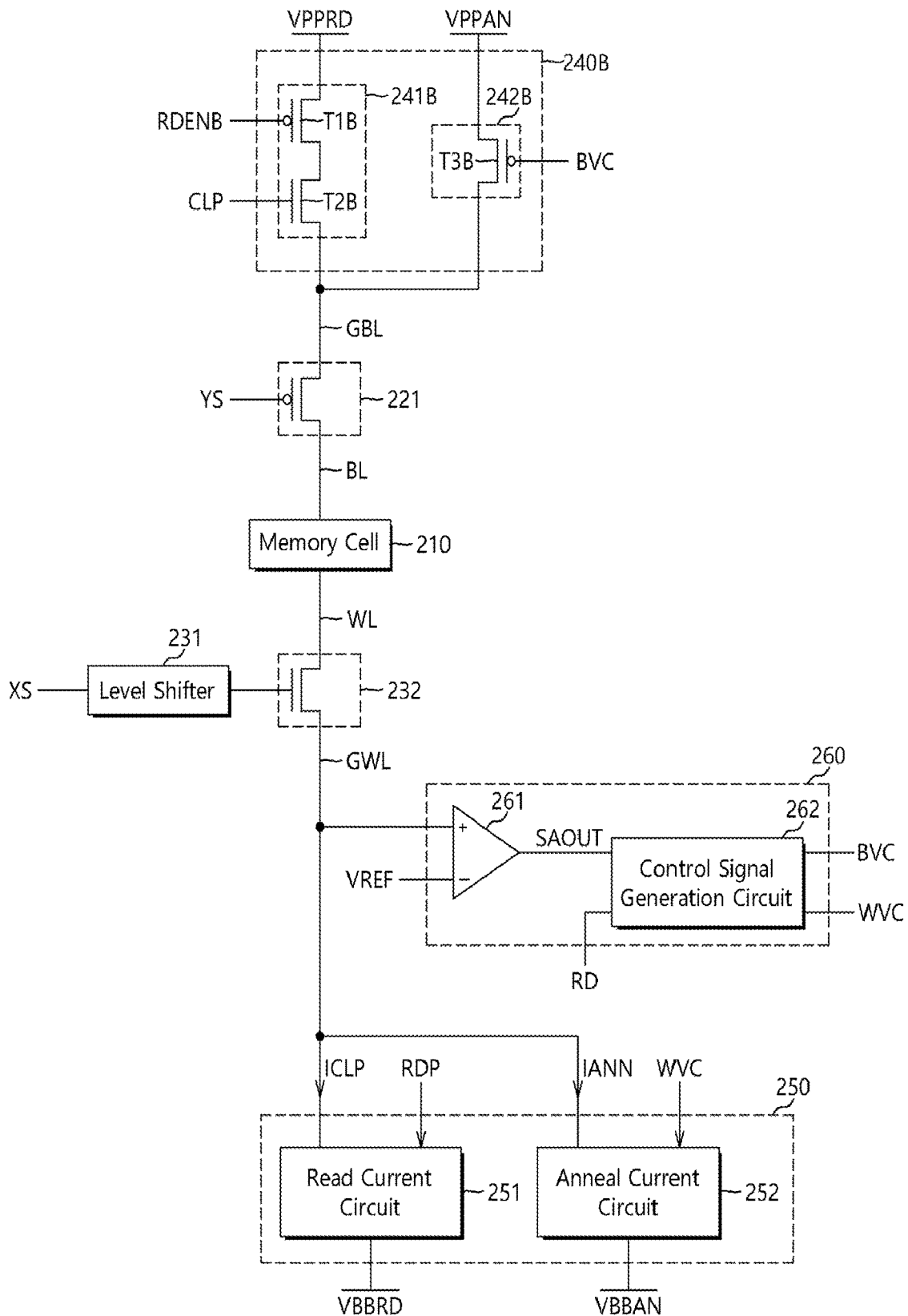
FIG. 2B is a diagram illustrating a configuration of a nonvolatile memory apparatus in accordance with an embodiment.

FIG. 2B is a diagram illustrating a configuration of a nonvolatile memory apparatus in accordance with an embodiment. The nonvolatile memory apparatus 200B may be applied as the nonvolatile memory apparatus 100 illustrated in FIG. 1. The nonvolatile memory apparatus 200B may include a memory cell 210, a bit line control circuit 240B, a word line control circuit 250 and a sense amplifier 260. The nonvolatile memory apparatus 200B may have substantially the same components as those of the nonvolatile memory device 200A illustrated in FIG. 2A, except the bit line control circuit 240B. The overlapping descriptions of the same components will be omitted herein.

The bit line control circuit 240B may provide one of first and second high voltages to the global bit line GBL, based on the read signal RD and the first control signal BVC. The bit line control circuit 240B may receive an anneal high voltage VPPAN with the first read supply voltage VPPRD. The anneal high voltage VPPAN may have a voltage level lower than the first read supply voltage VPPRD and higher than the first high voltage. The bit line control circuit 240B may generate the first high voltage from the first read supply voltage VPPRD, and generate the second high voltage from the anneal high voltage VPPAN. The bit line control circuit 240B may provide the first high voltage to the global bit line GBL based on the read signal RD, and provide the second high voltage to the global bit line GBL based on the first control signal BVC. The second high voltage may have a higher voltage level than the first high voltage. Because the bit line control circuit 240B provides the second high voltage from the anneal high voltage VPPAN having a lower voltage level than the first read supply voltage VPPRD, the bit line control circuit 240B can reduce power consumption of the nonvolatile memory apparatus 200B while supplying a sufficient voltage capable of annealing and/or setting back the memory cell 210.

The bit line control circuit 240B may include a read voltage supply circuit 241B and an anneal voltage supply circuit 242B. The read voltage supply circuit 241B may receive the first read supply voltage VPPRD, and provide the first high voltage to the global bit line GBL based on the read signal RD. The read voltage supply circuit 241B may provide the first high voltage to the global bit line GBL based on a read enable signal RDENB and a clamp signal CLP. The read voltage supply circuit 241B may clamp the first read supply voltage VPPRD based on the read enable signal RDENB and the clamp signal CLP, and provide the global bit line GBL with the first high voltage having a lower voltage level than the first read supply voltage VPPRD.

The anneal voltage supply circuit 242B may receive the anneal high voltage VPPAN and the first control signal BVC. The anneal voltage supply circuit 242B may provide the second high voltage to the global bit line GBL based on the first control signal BVC. The second high voltage may have a voltage level equal to or lower than the anneal high voltage VPPAN and higher than the first high voltage. The anneal voltage supply circuit 242B may raise the voltage level of the global bit line GBL based on the first control signal BVC. When the first control signal BVC is enabled, the anneal voltage supply circuit 242B may raise the voltage of the global bit line GBL from the first high voltage to the second high voltage.

The read voltage supply circuit 241B may include a first transistor T1B and a second transistor T2B. The first transistor T1B may be a P-channel MOS transistor, and the second transistor T2B may be an N-channel MOS transistor. The first transistor T1B may have a gate configured to receive the read enable signal RDENB and a source configured to receive the first read supply voltage VPPRD. The second transistor T2B may have a gate configured to receive the clamp signal CLP, a drain coupled to a drain of the first transistor T1B, and a source coupled to the global bit line GBL. When the read enable signal RDENB is enabled to a low level, the first transistor T1B may provide the first read supply voltage VPPRD to the drain of the second transistor T2B. The second transistor T2B may clamp the voltage level of the first read supply voltage VPPRD based on the clamp signal CLP, and provide the clamped voltage as the first high voltage to the global bit line GBL. For example, the first high voltage may have a voltage level VPPRD−VthT2B obtained by subtracting the threshold voltage VthT2B of the second transistor T2B from the first read supply voltage VPPRD.

The anneal voltage supply circuit 242B may include a third transistor T3B. The third transistor T3B may include a P-channel MOS transistor. The third transistor T3B may have a gate configured to receive the first control signal BVC, a source configured to receive the anneal high voltage VPPAN, and a drain coupled to the global bit line GBL. When the first control signal BVC is enabled, the third transistor T3B may provide a voltage, which has substantially the same voltage level as the anneal high voltage VPPAN, as the second high voltage to the global bit line GBL.

Figure 3:
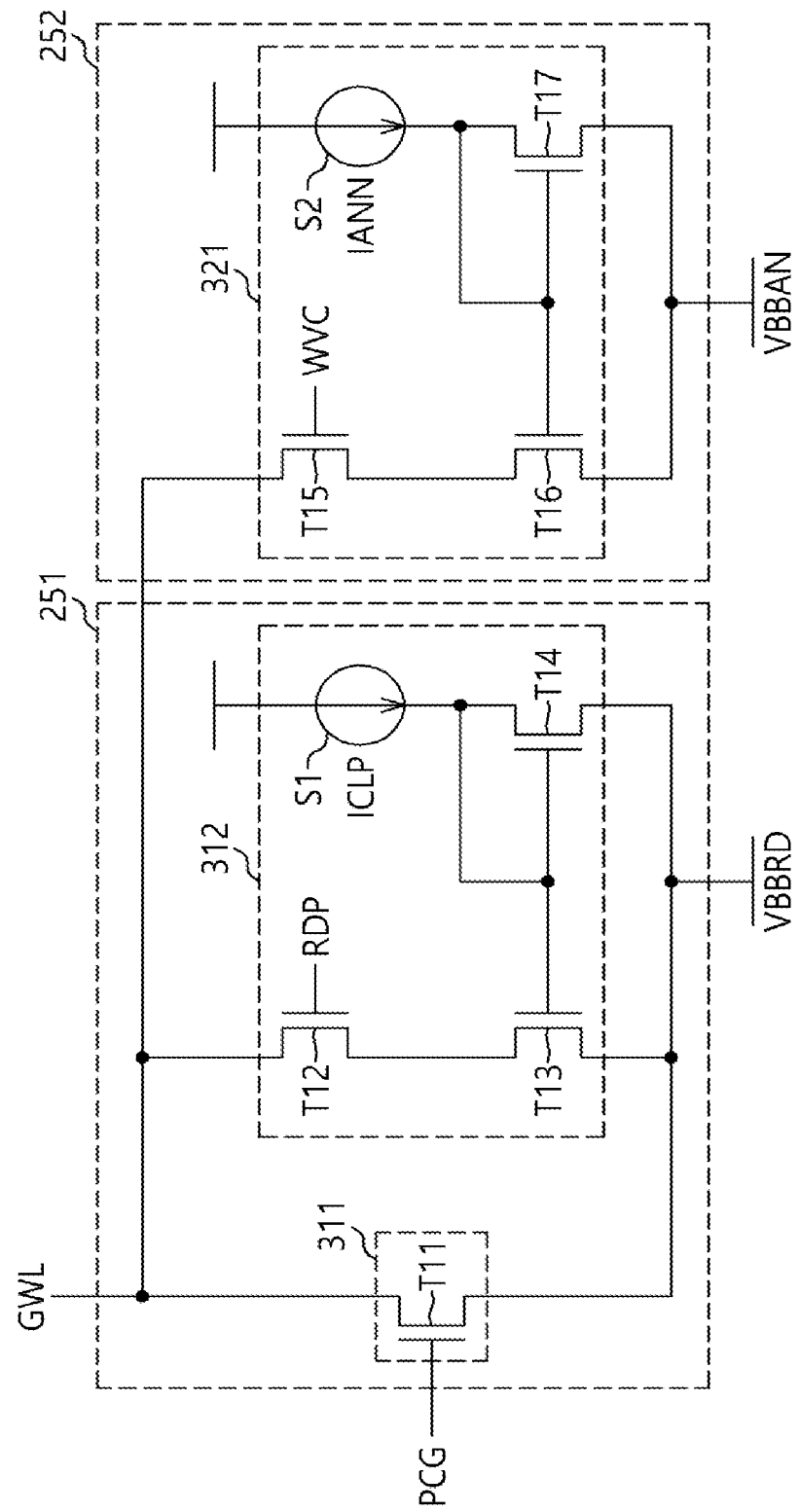
FIG. 3 is a diagram illustrating a configuration of a word line control circuit illustrated in FIGS. 2A and 2B.

FIG. 3 is a diagram illustrating the configuration of the word line control circuit 250 illustrated in FIGS. 2A and 2B. In FIG. 3, the word line control circuit 250 may include a read current circuit 251 and an anneal current circuit 252. The read current circuit 251 may include a precharge circuit 311 and a first current mirror 312. The precharge circuit 311 may precharge the voltage level of the global word line GWL with the second read supply voltage VBBRD, when a read operation is performed. The precharge circuit 311 may receive a precharge signal PCG. The precharge signal PCG may be a pulse signal which can be enabled before the read enable signal RDENB is enabled based on the read signal RD, during the read operation of the nonvolatile memory apparatus 200A or 200B. The precharge circuit 311 may provide the second read supply voltage VBBRD to the global word line GWL, based on the precharge signal PCG. The precharge circuit 311 may include a first transistor T11. The first transistor T11 may be an N-channel MOS transistor. The first transistor T11 may have a gate configured to receive the precharge signal PCG, a drain coupled to the global word line GWL, and a source configured to receive the second read supply voltage VBBRD.

The first current mirror 312 may include a first current source S1 configured to provide the first current ICLP. The first current mirror 312 may receive the read pulse signal RDP, provide the second read supply voltage VBBRD to the global word line GWL based on the read pulse signal RDP, and mirror the first current ICLP provided by the first current source S1 such that the first current ICLP flows through the global word line GWL. The first current mirror 312 may include the first current source S1, a second transistor T12, a third transistor T13 and a fourth transistor T14. One end of the first current source S1 may be coupled to a supply voltage terminal having a random voltage level. The second to fourth transistors T12 to T14 may be N-channel MOS transistors. The second transistor T12 may have a gate configured to receive the read pulse signal RDP and a drain coupled to the global word line GWL. The third transistor T13 may have a gate coupled to the other end of the first current source S1, a drain coupled to a source of the second transistor T12, and a source configured to receive the second read supply voltage VBBRD. The fourth transistor T14 may have a gate and drain coupled to the gate of the third transistor T13 in common and a source configured to receive the second read supply voltage VBBRD.

The anneal current circuit 252 may include a second current mirror 321. The second current mirror 321 may include a second current source S2 configured to provide the second current IANN. The second current mirror 321 may receive the second control signal WVC, provide the anneal low voltage VBBAN to the global word line GWL based on the second control signal WVC, and mirror the second current IANN provided by the second current source S2 such that the second current IANN flows through the global word line GWL. The second current mirror 321 may include the second current source S2, a fifth transistor T15, a sixth transistor T16 and a seventh transistor T17. One end of the second current source S2 may be coupled to a supply voltage terminal having a random voltage level. The fifth to seventh transistors T15 to T17 may be N-channel MOS transistors. The fifth transistor T15 may have a gate configured to receive the second control signal WVC and a drain coupled to the global word line GWL. The sixth transistor T16 may have a gate coupled to the other end of the second current source S2, a drain coupled to a source of the fifth transistor T15, and a source configured to receive the anneal low voltage VBBAN. The seventh transistor T17 may have a gate and drain coupled to the gate of the sixth transistor T16 in common and a source configured to receive the anneal low voltage VBBAN.

Figure 4A:
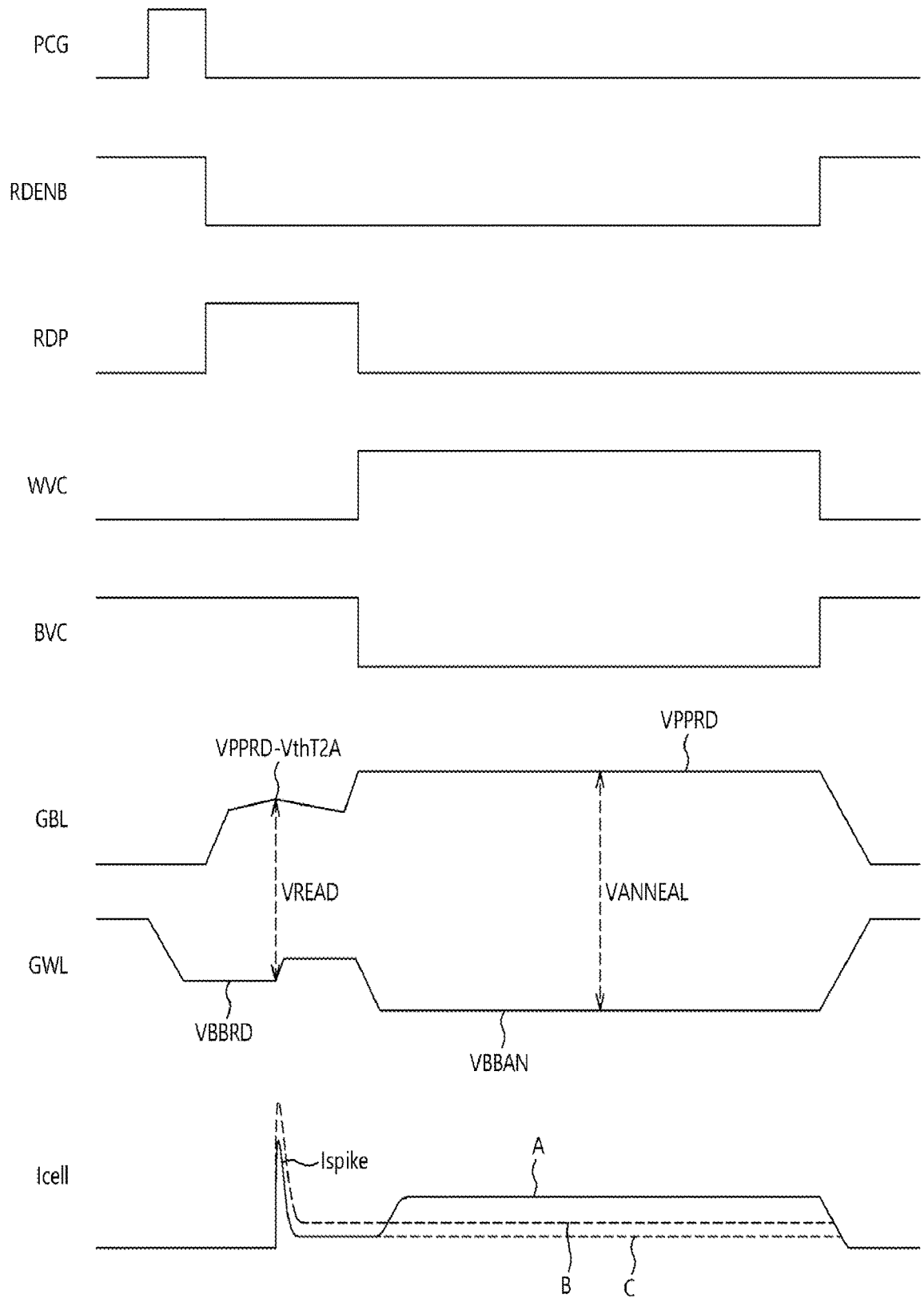
FIGS. 4A to 4C are timing diagrams illustrating operations of a nonvolatile memory apparatus in accordance with the embodiment.
Figure 4B:
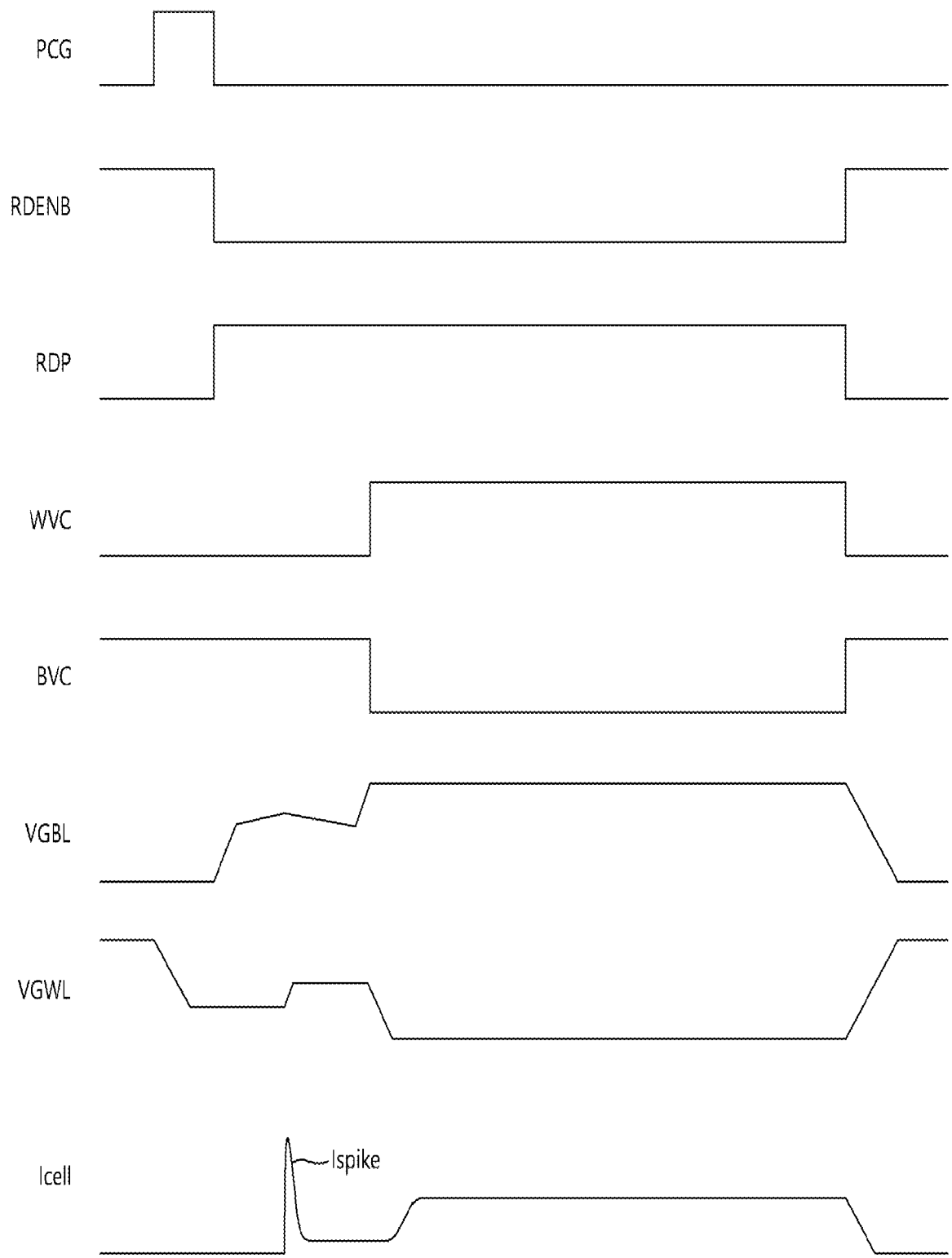
Figure 4C:
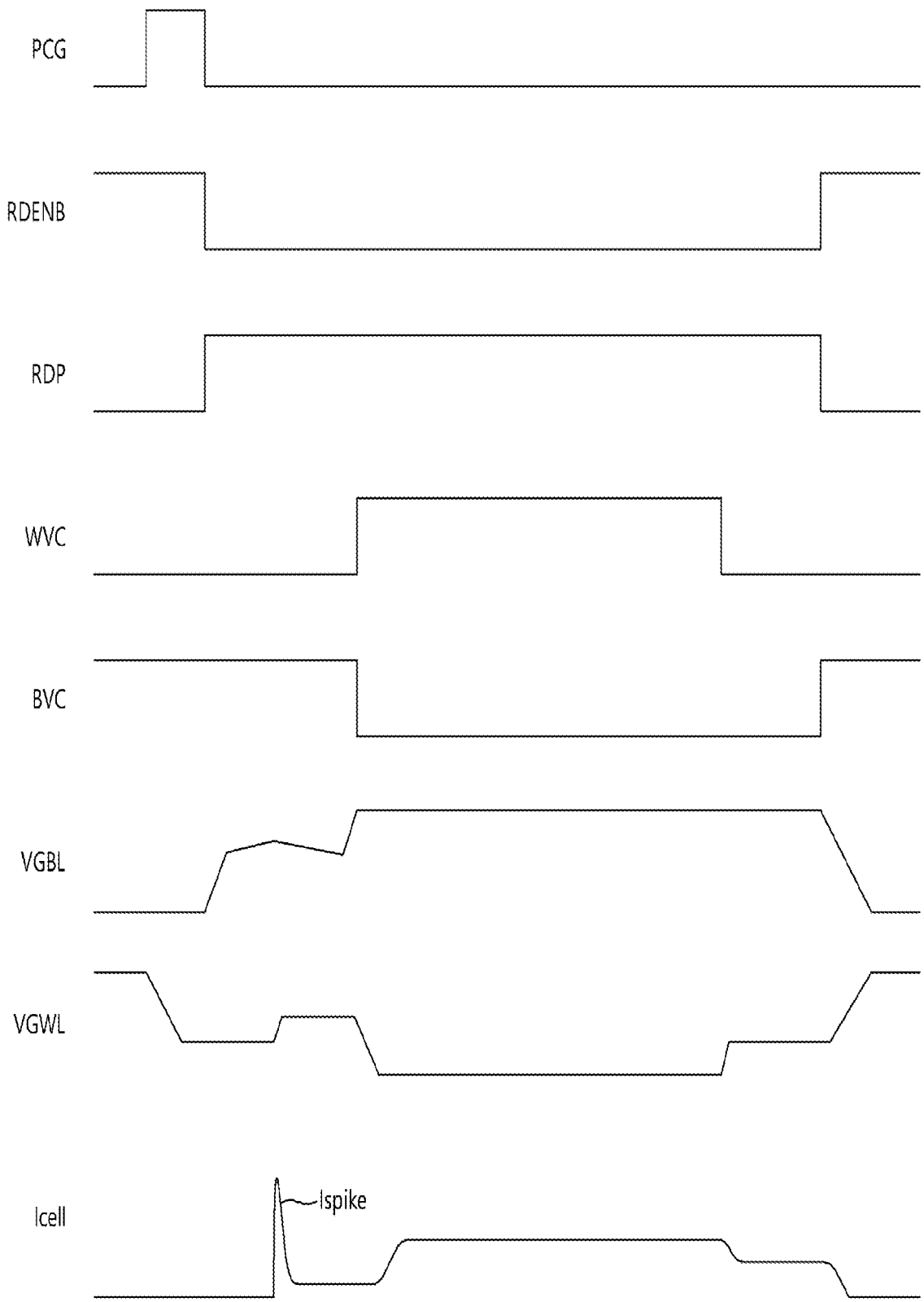

FIGS. 4A to 4C are timing diagrams illustrating operations of the nonvolatile memory apparatus in accordance with the embodiment. Referring to FIGS. 1, 2A, 3 and 4A, the operation of the nonvolatile memory apparatus 200A in accordance with the present embodiment will be described as follows. FIG. 4A illustrates pulses of the precharge signal PCG, the read enable signal RDENB, the read pulse signal RDP, the first control signal BVC and the second control signal WVC, changes in the voltage level VGBL of the global bit line GBL and the voltage level VGWL of the global word line GWL, and a memory cell current Icell flowing through the memory cell 210. When the read operation of the nonvolatile memory apparatus 200A is performed, the column selection switch 221 may couple the bit line BL to the global bit line GBL based on the column selection signal YS, and the row selection switch 232 may couple the word line WL to the global word line GWL based on the row selection signal XS. At this time, the level shifter 231 may lower the voltage level of the row selection signal XS and provide the row selection signal XS having the lowered voltage level to the row selection switch 232. When the read operation is performed, the precharge signal PCG may be first enabled. Based on the precharge signal PCG, the precharge circuit 311 may precharge the global word line GWL with the voltage level of the second read supply voltage VBBRD corresponding to the first low voltage. Therefore, the voltage level VGWL of the global word line may be lowered to the level of the second read supply voltage VBBRD.

The precharge signal PCG may be disabled, the read enable signal RDENB may be enabled to a low level, and the clamp signal CLP and the read pulse signal RDP may be enabled to a high level. The read current circuit 251 may continuously provide the second read supply voltage VBBRD to the global word line GWL based on the read pulse signal RDP, and control the first current ICLP to flow through the global word line GWL. The read voltage supply circuit 241A may provide the first read supply voltage VPPRD to the global bit line GBL based on the read pulse signal RDP. At this time, the read voltage supply circuit 241A may clamp the voltage level of the first read supply voltage VPPRD, such that the first high voltage VPPRD−VthT2A(VthT2B) can be provided to the global bit line GBL. When the voltage level VGBL of the global bit line GBL is sufficiently raised to the voltage level of the first high voltage VPPRD−VthT2A, a voltage corresponding to a read voltage VREAD may be applied across the memory cell 210, and snapback of the memory cell in the low resistance state may occur. When the snapback of the memory cell 210 occurs, the resistance value of the memory cell 210 may rapidly decrease, and the memory cell current Icell which is a current flowing through the memory cell 210 may be rapidly increased to generate a spike current Ispike. When the snapback of the memory cell 210 occurs, the memory cell current Icell may be increased to lower the voltage level VGBL of the global bit line and to raise the voltage level VGWL of the global word line. The sense amplifier 260 may sense the change in voltage level VGWL of the global word line, and enable the first and second control signals BVC and WVC.

The bypass circuit 242A may provide the first read supply voltage VPPRD to the global bit line GBL based on the first control signal BVC, and the voltage level VGBL of the global bit line may be raised to a voltage level close to the voltage level of the first read supply voltage VPPRD. The anneal current circuit 252 may provide the anneal low voltage VBBAN to the global word line GWL based on the second control signal WVC, and control the second current IANN to flow through the global word line GWL. A voltage level difference between the voltage level VGBL of the global bit line and the voltage level VGWL of the global word line may become an anneal voltage VANNEAL higher than the read voltage VREAD. As the second current IANN is controlled to flow through the global word line GWL, the memory cell current Icell may become the second current IANN. Therefore, as crystallization of the memory cell 210 progresses, the resistance state of the memory cell 210 may be set to a low resistance state. When the resistance state of the memory cell 210 is set to the low resistance state, the read operation may be ended. Therefore, the read enable signal, the read pulse signal, the first control signal and the second control signal may be all disabled, the voltage level VGWL of the global word line may be raised, and the voltage level VGBL of the global bit line may be lowered.

The nonvolatile memory apparatus 200A in accordance with the present embodiment may include the level shifter 231 configured to lower the voltage level of the row selection signal XS and provide the row selection signal XS having the lowered voltage level to the row selection switch 232. When the voltage level of the row selection signal XS is lowered, the amount of current flowing through the row selection switch 232 may be decreased to reduce the amount of the spike current Ispike which is generated when snapback of the memory cell 210 occurs. When the spike current Ispike is decreased, it is possible to mitigate disturbance that changes the memory cell 210 in the low resistance state to the high resistance state.

When snapback of the memory cell occurs during the read operation of the nonvolatile memory apparatus, disturbance may occur to change the memory cell 210 in the low resistance state to the high resistance state. In order to mitigate the disturbance, the following methods may be used: the first method is to reset the resistance state of the memory cell to the low resistance state when snapback of the memory cell occurs, and the second method is to reduce the amount of the spike current. When the amount of the spike current Ispike is increased as indicated by B, the amount of the current applied to the memory cell 210 after the occurrence of snapback of the memory cell 210 may be increased to provide the anneal current to the memory cell 210. However, disturbance may easily occur due to the spike current Ispike. The anneal current which is generated by increasing the spike current Ispike may be not enough to set the memory cell in the low resistance state. On the other hand, when the amount of the spike current Ispike is reduced as indicated by C, disturbance caused by the spike current Ispike may be mitigated, but a sufficient anneal current might not be supplied to the memory cell 210 after the occurrence of the snapback of the memory cell 210, which makes it difficult to retain the memory cell in the low resistance state. As indicated by A, the nonvolatile memory apparatus 200A in accordance with the present embodiment can supply a sufficient anneal current while reducing the spike current Ispike. The nonvolatile memory apparatus 200A in accordance with the present embodiment may lower the voltage level of the row selection signal XS to reduce the spike current Ispike generated in case of snapback of the memory cell 210, thereby mitigating disturbance caused by the spike current Ispike. Furthermore, as the nonvolatile memory apparatus 200A supplies a sufficient anneal current to the memory cell 210 after the occurrence of the snapback of the memory cell 210, the low resistance state of the memory cell 210 may be set enough to mitigate the disturbance.

FIG. 4B is a timing diagram illustrating another operation of the nonvolatile memory apparatus 200A. Referring to FIGS. 2A and 4B, the read pulse signal RDP may be continuously enabled during an interval in which the read enable signal RDENB is enabled. The read pulse signal RDP may be enabled substantially at the same time as the read enable signal RDENB, and disabled substantially at the same time as the read enable signal RDENB. The word line control circuit 250 may supply the first current ICLP to the memory cell 210 in response to the read pulse signal RDP, and additionally supply the second current IANN to the memory cell 210 such that the second current IANN overlaps the first current ICLP, when the second control signal WVC is enabled. When the read pulse signal RDP retains the enabled state even though the second control signal WVC is enabled, it is possible to reduce switching noise which occurs while the current supplied to the memory cell 210 is changed from the first current ICLP to the second current IANN. Therefore, the waveform of the anneal current applied to the memory cell may be further improved.

FIG. 4C is a timing diagram illustrating still another operation of the nonvolatile memory apparatus 200A. Referring to FIGS. 2A and 4C, the read pulse signal RDP may be continuously enabled during an interval in which the read enable signal RDENB is enabled as illustrated in FIG. 4B. In an embodiment, the read pulse signal RDP may be disabled before the read enable signal RDENB, as illustrated in FIG. 4A. The control signal generation circuit 262 of the sense amplifier 260 may disable the second control signal WVC before the first control signal BVC. That is, the second control signal WVC may be disabled before the point of time that the read signal RD is disabled. When the second control signal WVC is first disabled, the voltage level VGWL of the global word line may rise in a stepwise manner, before the voltage level VGBL of the global bit line falls, as illustrated in FIG. 4C. The step of annealing and/or setting back the memory cell by applying the anneal current may include a nucleation step of forming a crystallization nucleus and a growth step of growing the crystallization nucleus. In addition, the step of annealing and/or setting back the memory cell by applying the anneal current may include a ramping-down step of ramping down the current flowing through the memory cell in a stepwise manner when the crystallization nucleus is sufficiently grown. When the second control signal WVC is disabled before the first control signal BVC, the anneal current supplied to the memory cell 210 may be ramped down in a stepwise manner, in order to easily implement the ramping-down step. Furthermore, the read operation time may be reduced to improve read latency and to additionally mitigate read disturbance.

Figure 5:
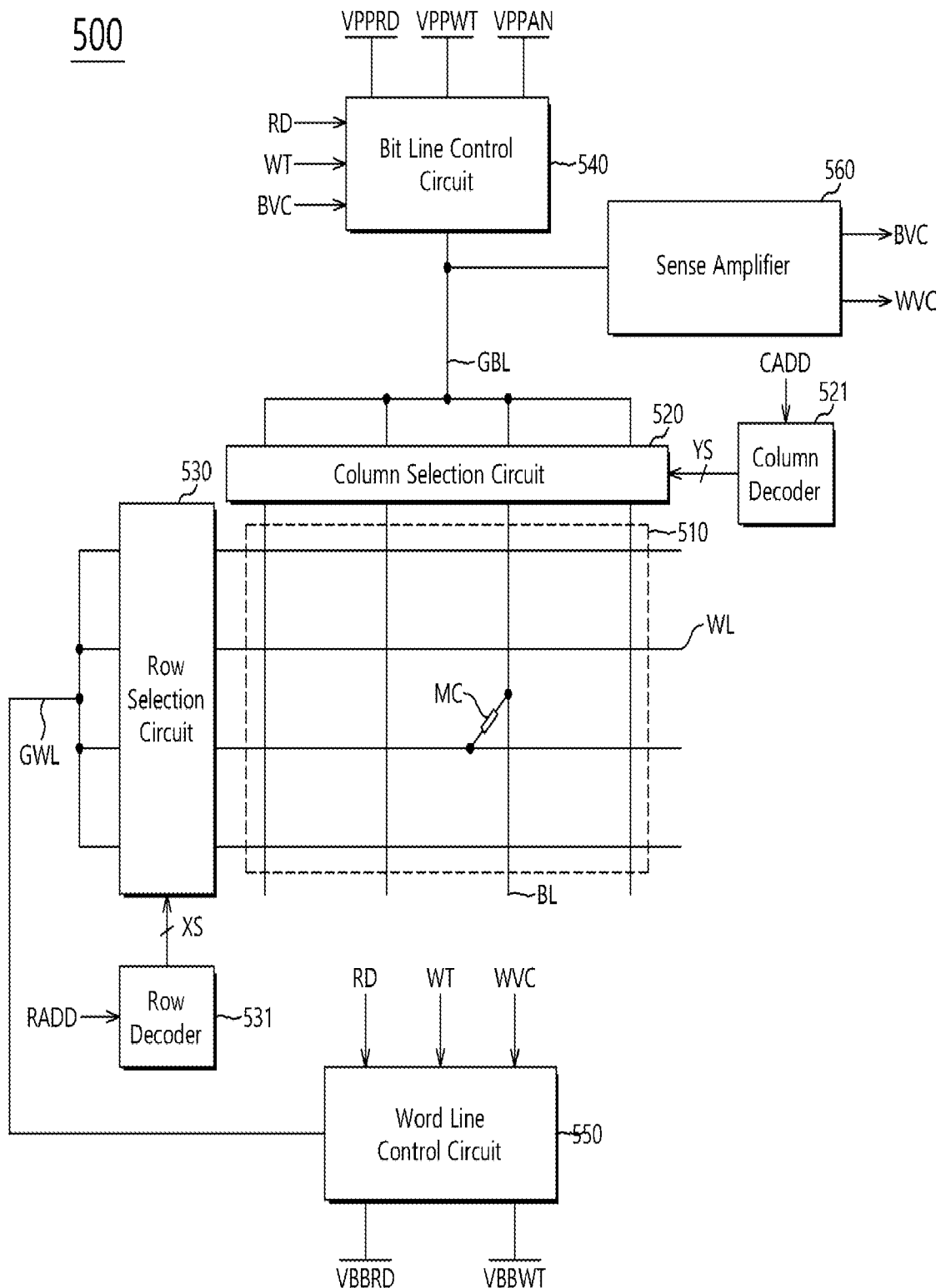
FIG. 5 is a diagram illustrating a configuration of a nonvolatile memory apparatus in accordance with an embodiment.

FIG. 5 is a diagram illustrating a configuration of a nonvolatile memory apparatus 500 in accordance with an embodiment. In FIG. 5, the nonvolatile memory apparatus 500 may include a memory array 510. The memory array 510 may include a plurality of bit lines BL arranged in a column direction and a plurality of word lines WL arranged in a row direction. A plurality of memory cells MC may be coupled to the respective intersections between the plurality of bit lines BL and the plurality of word lines WL. Each of the memory cells MC may be coupled between the bit line BL and the word line WL which correspond thereto.

The nonvolatile memory apparatus 500 may include a column selection circuit 520 and a row selection circuit 530. The column selection circuit 520 may be coupled between a global bit line GBL and the plurality of bit lines BL. The column selection circuit 520 may couple a bit line selected among the plurality of bit lines BL to the global bit line GBL. The column selection circuit 520 may select a specific bit line among the plurality of bit lines BL based on a column selection signal YS which may be generated based on a column address signal CADD, and couple the selected bit line to the global bit line GBL. The column selection circuit 520 may raise the voltage level of the column selection signal YS, and select a bit line based on the column selection signal YS having the raised voltage level. The row selection circuit 530 may be coupled between the global word line GWL and the plurality of word lines WL. The row selection circuit 530 may couple a word line selected among the plurality of word lines WL to the global word line GWL. The row selection circuit 530 may select a specific word line among the plurality of word lines WL based on a row selection signal XS which may be generated based on a row address signal RADD, and couple the selected word line to the global word line GWL.

The nonvolatile memory apparatus 500 may further include a column decoder 521 and a row decoder 531. The column decoder 521 may generate the column selection signal YS based on the column address signal CADD. The column decoder 521 may decode the column address signal CADD and generate the column selection signal YS for the column selection circuit 520 to select a specific bit line. The row decoder 531 may generate the row selection signal XS based on the row address signal RADD. The row decoder 531 may decode the row address signal RADD and generate the row selection signal XS for the row selection circuit 530 to select a specific word line.

The nonvolatile memory apparatus 500 may include a bit line control circuit 540, a word line control circuit 550 and a sense amplifier 560. The bit line control circuit 540 may be coupled to the global bit line GBL. The bit line control circuit 540 may change the voltage level of the global bit line GBL for read and write operations of the nonvolatile memory apparatus 500. The bit line control circuit 540 may receive a read signal RD, a write signal WT and a first control signal BVC, and provide one or more voltages to the global bit line GBL. The bit line control circuit 540 may change a current flowing through the memory cell MC by changing a current flowing through the global bit line GBL, based on the read signal RD and the first control signal BVC.

The bit line control circuit 540 may provide one or more voltages to the global bit line GBL based on the read signal RD and the write signal WT. For example, the bit line control circuit 540 may receive a first read supply voltage VPPRD, and apply the first read supply voltage VPPRD to the global bit line GBL based on the read signal RD during the read operation. The bit line control circuit 540 may receive a first write supply voltage VPPWT, and apply the first write supply voltage VPPWT to the global bit line GBL based on the write signal WT. The bit line control circuit 540 may provide an anneal high voltage VPPAN to the global bit line GBL based on the first control signal BVC. The anneal high voltage VPPAN may have a higher voltage level than the first read supply voltage VPPRD. The anneal high voltage VPPAN may have a lower voltage level than the first write supply voltage VPPWT.

The bit line control circuit 540 may control a first current to flow through the global bit line GBL based on the read signal RD. The bit line control circuit 540 may control a second current to flow through the global bit line GBL based on the first control signal BVC. The second current may have a larger amount than the first current. The second current may be an anneal current and/or set-back current for retaining and/or setting the memory cell MC in a low resistance state.

The word line control circuit 550 may be coupled to the global word line GWL. The word line control circuit 550 may change the voltage level of the global word line GWL for read and write operations of the nonvolatile memory apparatus 500. The word line control circuit 550 may receive the read signal RD, the write signal WT and a second control signal WVC, and drive the global word line GWL with one or more voltages.

The word line control circuit 550 may provide one or more voltages to the global word line GWL based on the read signal RD or the write signal WT. For example, the word line control circuit 550 may receive a second read supply voltage VBBRD, and provide a first low voltage to the global word line GWL based on the read signal RD during the read operation. The word line control circuit 550 may apply a second write supply voltage VBBWT to the global word line GWL based on the write signal WT during the write operation. The first low voltage may have a higher voltage level than the second read supply voltage VBBRD. Although described below, the first low voltage may be set to a voltage level capable of applying a voltage corresponding to a read voltage across the memory cell MC, and the second write supply voltage VBBWT may be set to a voltage level capable of applying a voltage corresponding to a write voltage across the memory cell MC.

The word line control circuit 550 may decrease the voltage level of the global word line GWL based on the second control signal WVC. For example, when the second control signal WVC is enabled, the word line control circuit 550 may provide the global word line GWL with a second low voltage having a lower voltage level than the first low voltage. For example, the second low voltage may have a voltage level equal to or higher than the second read supply voltage VBBRD. A voltage level difference between the first read supply voltage VPPRD and the first low voltage may be set to correspond to the level of the read voltage. A voltage level difference between the first write supply voltage VPPWT and the second write supply voltage VBBWT may be set to correspond to the level of the write voltage. The anneal high voltage VPPAN may be set to such a voltage level that a voltage level difference between the anneal high voltage VPPAN and the second low voltage corresponds to a voltage level capable of annealing and/or setting back the memory cell MC.

The sense amplifier 560 may be coupled to the global bit line GBL. The sense amplifier 560 may sense snapback of the memory cell MC. The sense amplifier 560 may generate the first control signal BVC and the second control signal WVC by sensing the snapback of the memory cell MC. The sense amplifier 560 may sense the voltage level of the global bit line GBL to determine whether snapback of the memory cell MC occurred. The sense amplifier 560 may generate the first control signal BVC and the second control signal WVC based on whether snapback of the memory cell MC occurs during the read operation. For example, the sense amplifier 560 may retain the first and second control signals BVC and WVC in a disabled state, when snapback of the memory cell MC did not occur. The sense amplifier 560 may enable the first and second control signals BVC and WVC, when snapback of the memory cell MC occurred.

Figure 6A:
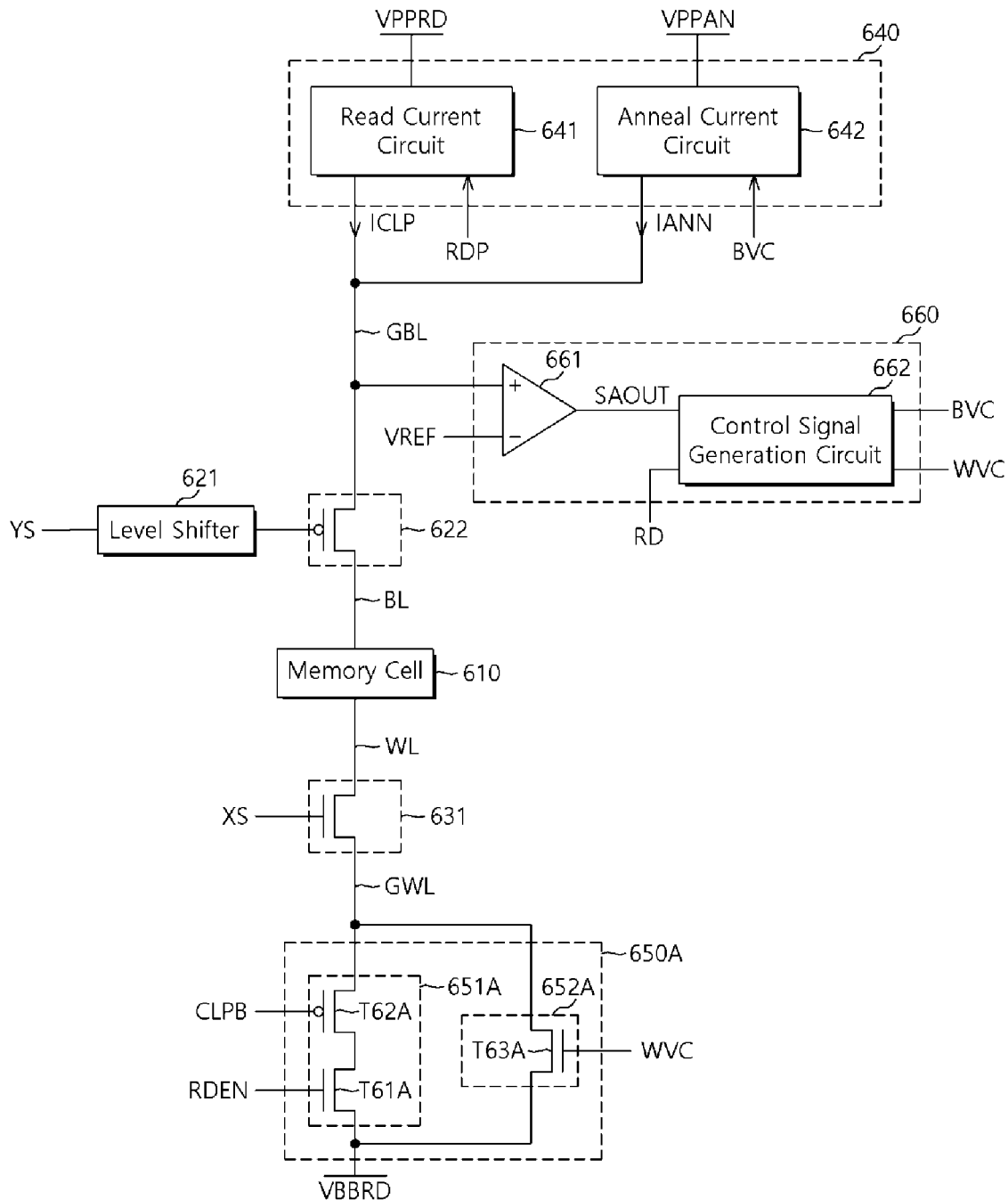
FIG. 6A is a diagram illustrating a configuration of a nonvolatile memory apparatus in accordance with an embodiment.

FIG. 6A is a diagram illustrating a configuration of a nonvolatile memory apparatus 600A in accordance with an embodiment. For clear description, FIG. 6A illustrates components of the nonvolatile memory apparatus, which can be coupled to one memory cell. Furthermore, FIG. 6A illustrates components of the nonvolatile memory apparatus for a read operation. The nonvolatile memory apparatus 600A may be applied as the nonvolatile memory apparatus 500 illustrated in FIG. 5. The nonvolatile memory apparatus 600A may include a memory cell 610, and the memory cell 610 may have one end coupled to a bit line BL and the other end coupled to a word line WL. The bit line BL may be coupled to the global bit line GBL, and the word line may be coupled to the global word line GWL.

The nonvolatile memory apparatus 600A may include a bit line control circuit 640, a word line control circuit 650A and a sense amplifier 660. The bit line control circuit 640 may provide one of first and second high voltages to the global word line GWL, based on the read signal RD and the first control signal BVC. The second high voltage may have a higher voltage level than the first high voltage. The first high voltage may correspond to the first read supply voltage VPPRD, and the second high voltage may correspond to the anneal high voltage VPPAN. When the read pulse signal RDP is enabled, the bit line control circuit 640 may provide the first read supply voltage VPPRD as the first high voltage to the global bit line GBL. When the first control signal BVC is enabled, the bit line control circuit 640 may provide the anneal high voltage VPPAN as the second high voltage to the global bit line GBL to raise the voltage level of the global bit line GBL.

The bit line control circuit 640 may control one of first and second currents ICLP and IANN to flow through the global bit line GBL, based on the read signal RD and the first control signal BVC. The bit line control circuit 640 may control the first current ICLP to flow through the global bit line GBL based on the read pulse signal RDP, and control the second current IANN to flow through the global bit line GBL based on the first control signal BVC. The first current ICLP may correspond to a clamping current flowing through the memory cell 610 for a read operation on the memory cell 610. The second current IANN may correspond to an anneal current for annealing and/or setting back the memory cell 610 to retain the memory cell 610 in a low resistance state. The second current IANN may be larger than the first current ICLP.

The bit line control circuit 640 may include a read current circuit 641 and an anneal current circuit 642. The read current circuit 641 may receive the first read supply voltage VPPRD, provide the first read supply voltage VPPRD to the global bit line GBL based on the read pulse signal RDP, and control the first current ICLP to flow through the global bit line GBL. The anneal current circuit 642 may receive the anneal high voltage VPPAN, provide the anneal high voltage VPPAN to the global bit line GBL based on the first control signal BVC, and control the second current IANN to flow through the global bit line GBL. Therefore, the anneal current circuit 642 may raise the voltage level of the global bit line GBL and increase the current flowing through the global bit line GBL, based on the first control signal BVC.

The word line control circuit 650A may provide one of first and second low voltages to the global word line GWL, based on the read signal RD and the second control signal WVC. The word line control circuit 650A may receive the second read supply voltage VBBRD, and generate the first and second low voltages from the second read supply voltage VBBRD. The word line control circuit 650A may provide the first low voltage to the global word line GWL based on the read enable signal RDEN, and provide the second low voltage to the global word line GWL based on the second control signal WVC. The second low voltage may have a lower voltage level than the first low voltage.

The word line control circuit 650A may include a read voltage supply circuit 651A and a bypass circuit 652A. The read voltage supply circuit 651A may receive the second read supply voltage VBBRD, and provide the first low voltage to the global word line GWL based on the read signal RD. The read voltage supply circuit 651A may provide the first low voltage to the global word line GWL based on a read enable signal RDEN and a clamp signal CLPB. The read enable signal RDEN may be generated based on the read signal RD during the read operation of the nonvolatile memory apparatus 600A. The clamp signal CLPB may be a bias voltage having a voltage level corresponding to a logic low level, for example. The read voltage supply circuit 651A may clamp the second read supply voltage VBBRD based on the read enable signal RDEN and the clamp signal CLPB, and provide the global word line GWL with the first low voltage having a higher voltage level than the second read supply voltage VBBRD.

The bypass circuit 652A may receive the second read supply voltage VBBRD and the second control signal WVC. The bypass circuit 652A may provide the second low voltage to the global word line GWL based on the second control signal WVC. The second low voltage may have a voltage level equal to or higher than the second read supply voltage VBBRD and lower than the first low voltage. The bypass circuit 652A may lower the voltage level of the global word line GWL based on the second control signal WVC. When the second control signal WVC is enabled, the bypass circuit 652A may lower the voltage of the global bit line GBL from the first low voltage to the second low voltage.

The read voltage supply circuit 651A may include a first transistor T61A and a second transistor T62A. The first transistor T61A may be an N-channel MOS transistor, and the second transistor T62A may be a P-channel MOS transistor. The first transistor T61A may have a gate configured to receive the read enable signal RDEN and a source configured to receive the second read supply voltage VBBRD. The second transistor T62A may have a gate configured to receive the clamp signal CLPB, a drain coupled to a drain of the first transistor T61A, and a source coupled to the global word line GWL. When the read enable signal RDEN is enabled to a high level, the first transistor T61A may provide the second read supply voltage VBBRD to the drain of the second transistor T62A. The second transistor T62A may clamp the voltage level of the second read supply voltage VBBRD when the clamp signal CLPB is enabled to a low level, and provide the clamped voltage as the first low voltage to the global word line GWL. For example, the first low voltage may have a voltage level corresponding to a voltage level obtained by raising the second read supply voltage VBBRD by the threshold voltage VthT62A of the second transistor T62A.

The bypass circuit 652A may include a third transistor T63A. The third transistor T63A may include an N-channel MOS transistor. The third transistor T63A may have a gate configured to receive the second control signal WVC, a source configured to receive the second read supply voltage VBBRD, and a drain coupled to the global word line GWL. When the second control signal WVC is enabled, the third transistor T63A may provide a voltage, which has substantially the same voltage level as the second read supply voltage VBBRD, as the second low voltage to the global word line GWL.

The sense amplifier 660 may be coupled to the global bit line GBL. The sense amplifier 660 may receive a reference voltage VREF. The reference voltage VREF may have a suitable voltage level capable of sensing a change in voltage level of the global bit line GBL, when snapback of the memory cell occurred. The sense amplifier 660 may generate an output signal SAOUT by comparing the voltage level of the global bit line GBL to the voltage level of the reference voltage VREF. The sense amplifier 660 may include a comparator 661 which compares and amplifies the voltage levels of the global bit line GBL and the reference voltage VREF. For example, when the voltage level of the global bit line GBL is lower than the voltage level of the reference voltage VREF, the sense amplifier 660 may change the output signal SAOUT from a low level to a high level. The sense amplifier 660 may generate the first control signal BVC which is enabled to a low level when the output signal SAOUT transitions to a high level, and the second control signal WVC which is enabled to a high level when the output signal SAOUT transitions to a high level. The sense amplifier 660 may further include a control signal generation circuit 662. The control signal generation circuit 662 may generate the first and second control signals BVC and WVC based on the output signal SAOUT and the read signal RD. The control signal generation circuit 662 may generate the first control signal BVC which is enabled to a low level when the output signal SAOUT transitions to a high level, and the second control signal WVC which is enabled to a high level when the output signal SAOUT transitions to a high level. The control signal generation circuit 662 may disable the first and second control signals BVC and WVC when the read signal RD is disabled.

In FIG. 6A, the nonvolatile memory apparatus 600A may further include a level shifter 621, a column selection switch 622 and a row selection switch 631. The level shifter 621 and the column selection switch 622 may be components of the column selection circuit 520 illustrated in FIG. 5, and the row selection switch 631 may be a component of the row selection circuit 530 illustrated in FIG. 5. The level shifter 621 may receive the column selection signal YS. The level shifter 621 may raise the voltage level of the column selection signal YS. The column selection switch 622 may receive an output of the level shifter 621 and couple a bit line BL to the global bit line GBL such that the memory cell 610 can be coupled to the global bit line GBL. The row selection switch 631 may receive the row selection signal XS and couple a word line WL to the global word line GWL such that the memory cell 610 can be coupled to the global word line GWL.

Figure 6B:
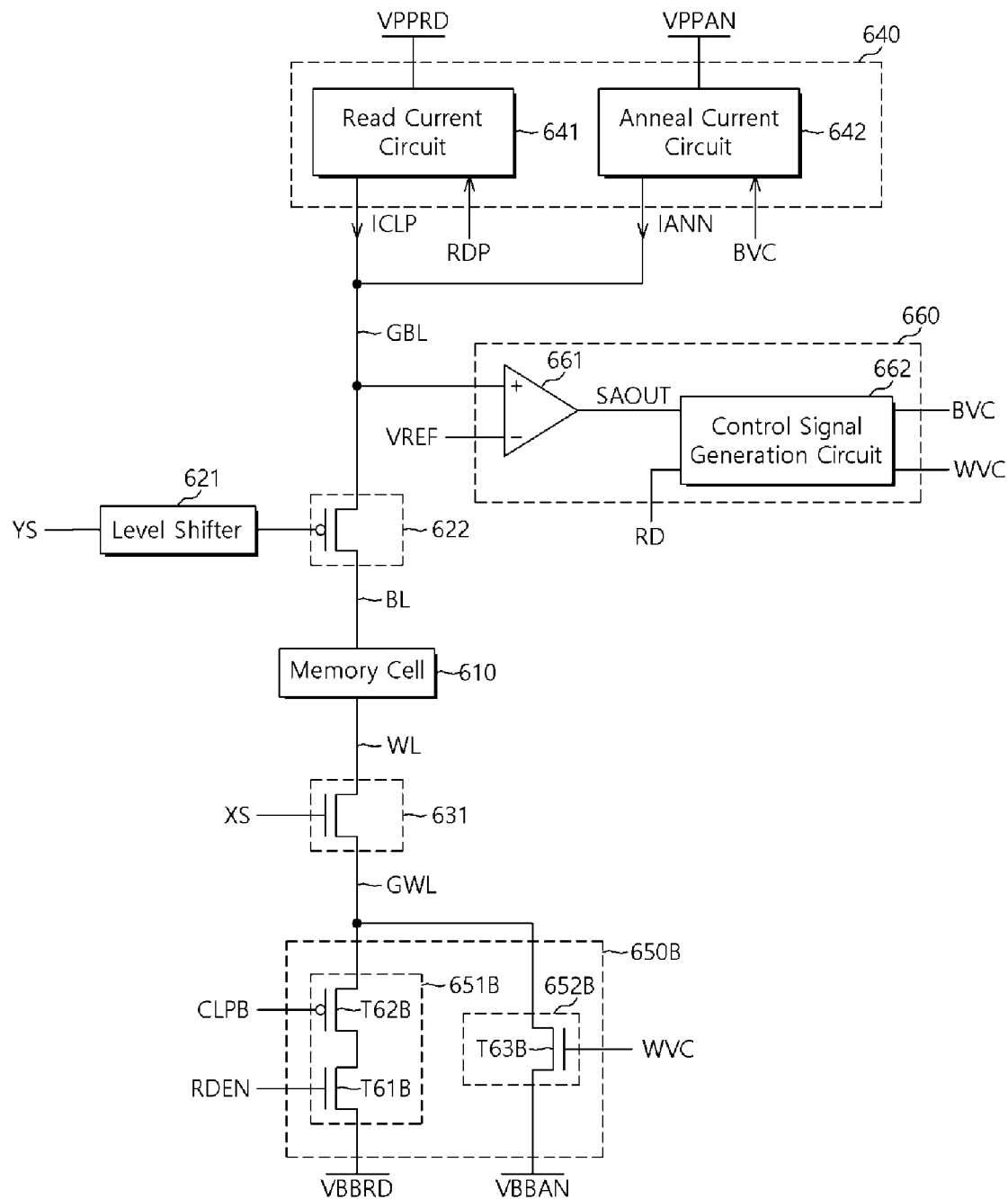
FIG. 6B is a diagram illustrating a configuration of a nonvolatile memory apparatus in accordance with an embodiment.

FIG. 6B is a diagram illustrating a configuration of a nonvolatile memory apparatus 600B in accordance with an embodiment. The nonvolatile memory apparatus 600B may be applied as the nonvolatile memory apparatus 500 illustrated in FIG. 5. The nonvolatile memory apparatus 600B may include a memory cell 610, a bit line control circuit 640, a word line control circuit 650B and a sense amplifier 660. The nonvolatile memory apparatus 600B may have substantially the same components as those of the nonvolatile memory device 600A illustrated in FIG. 6A, except the word line control circuit 650B. The overlapping descriptions of the same components will be omitted herein.

The word line control circuit 650B may provide one of the first and second low voltages to the global word line GWL, based on the read signal RD and the second control signal WVC. The word line control circuit 650B may receive the anneal low voltage VBBAN with the second read supply voltage VBBRD. The anneal low voltage VBBAN may have a higher voltage level than the second read supply voltage VBBRD. The anneal low voltage VBBRD may have a lower voltage level than the first low voltage. The word line control circuit 650B may generate the first low voltage from the second read supply voltage VBBRD, and generate the second low voltage from the anneal low voltage VBBAN. The word line control circuit 650B may provide the first low voltage to the global word line GWL based on the read enable signal RDEN, and provide the second low voltage to the global word line GWL based on the second control signal WVC. The second low voltage may have a lower voltage level than the first low voltage.

The word line control circuit 650B may include a read voltage supply circuit 651B and an anneal voltage supply circuit 652B. The read voltage supply circuit 651B may receive the second read supply voltage VBBRD, and provide the first low voltage to the global word line GWL based on the read signal RD. The read voltage supply circuit 651B may provide the first low voltage to the global word line GWL based on the read enable signal RDEN and the clamp signal CLPB. The read voltage supply circuit 651B may clamp the second read supply voltage VBBRD based on the read enable signal RDEN and the clamp signal CLPB, and provide the global word line GWL with the first low voltage having a higher voltage level than the second read supply voltage VBBRD.

The anneal voltage supply circuit 652B may receive the anneal low voltage VBBAN and the second control signal WVC. The anneal voltage supply circuit 652B may provide the second low voltage to the global word line GWL based on the second control signal WVC. The second low voltage may have a voltage level equal to or higher than the anneal low voltage VBBAN and lower than the first low voltage. The anneal voltage supply circuit 652B may lower the voltage level of the global word line GWL based on the second control signal WVC. When the second control signal WVC is enabled, the anneal voltage supply circuit 652B may lower the voltage of the global bit line GBL from the first low voltage to the second low voltage.

The read voltage supply circuit 651B may include a first transistor T61B and a second transistor T62B. The first transistor T61B may be an N-channel MOS transistor, and the second transistor T62B may be a P-channel MOS transistor. The first transistor T61B may have a gate configured to receive the read enable signal RDEN and a source configured to receive the second read supply voltage VBBRD. The second transistor T62B may have a gate configured to receive the clamp signal CLPB, a drain coupled to a drain of the first transistor T61B, and a source coupled to the global word line GWL. When the read enable signal RDEN is enabled to a high level, the first transistor T61B may provide the second read supply voltage VBBRD to the drain of the second transistor T62B. The second transistor T62B may clamp the voltage level of the second read supply voltage VBBRD when the clamp signal CLPB is enabled to a low level, and provide the clamped voltage as the first low voltage to the global word line GWL. For example, the first low voltage may have a voltage level corresponding to a voltage level obtained by raising the second read supply voltage VBBRD by the threshold voltage VthT62B of the second transistor T62B.

The anneal voltage supply circuit 652B may include a third transistor T63B. The third transistor T63B may include an N-channel MOS transistor. The third transistor T63B may have a gate configured to receive the second control signal WVC, a source configured to receive the anneal low voltage VBBAN, and a drain coupled to the global word line GWL. When the second control signal WVC is enabled, the third transistor T63B may provide a voltage, which has substantially the same voltage level as the anneal low voltage VBBAN, as the second low voltage to the global word line GWL.

Figure 7:
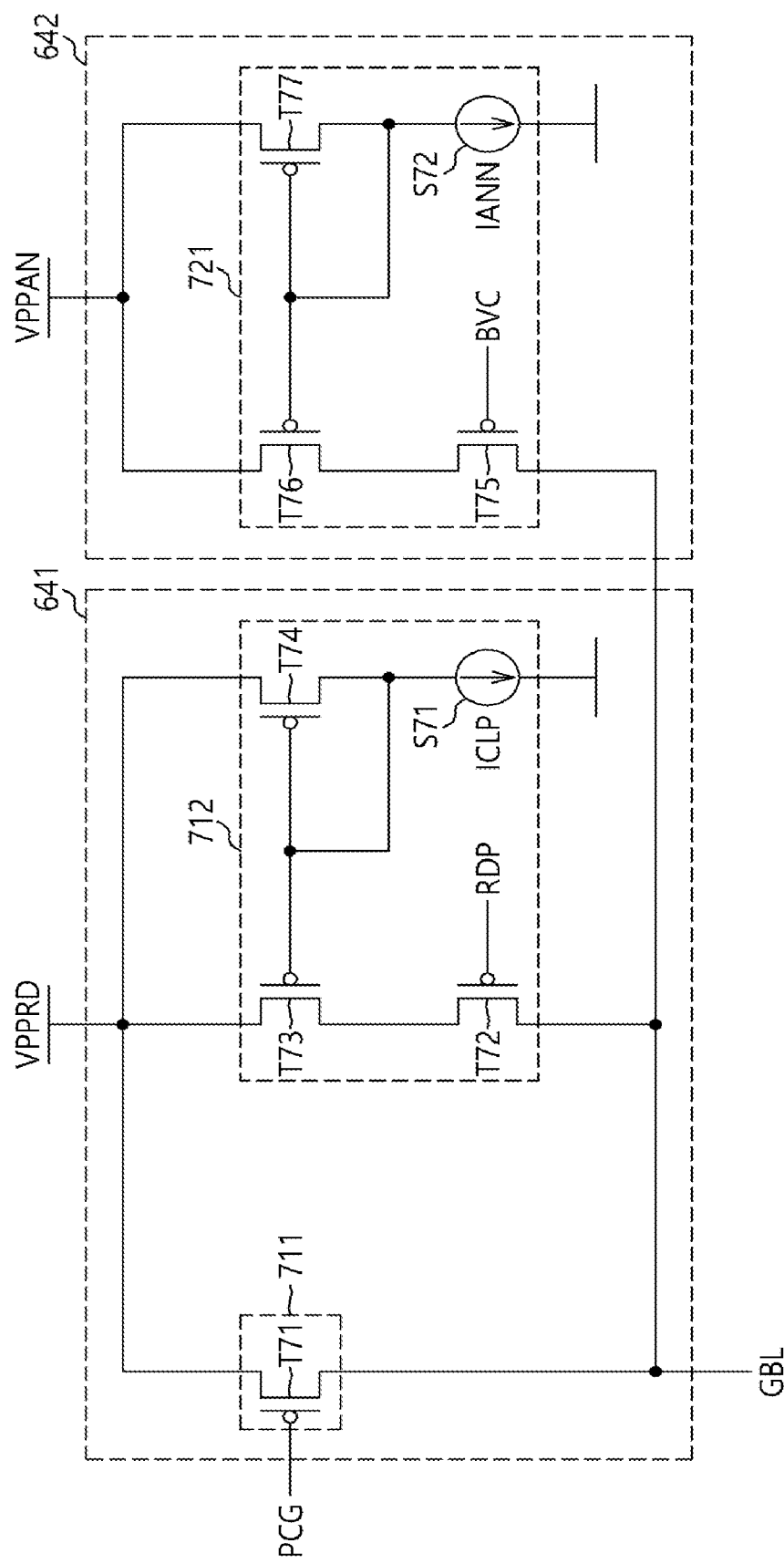
FIG. 7 is a diagram illustrating a configuration of a bit line control circuit illustrated in FIGS. 6A and 6B.

FIG. 7 is a diagram illustrating the configuration of the bit line control circuit 640 illustrated in FIGS. 6A and 6B. In FIG. 7, the bit line control circuit 640 may include a read current circuit 641 and an anneal current circuit 642. The read current circuit 641 may include a precharge circuit 711 and a first current mirror 712. The precharge circuit 711 may precharge the voltage level of the global bit line GBL with the first read supply voltage VPPRD, when a read operation is performed. The precharge circuit 711 may receive a precharge signal PCGB. The precharge signal PCGB may be a pulse signal which can be enabled before the read enable signal RDEN is enabled based on the read signal RD, during the read operation of the nonvolatile memory apparatus 600A or 600B. The precharge circuit 711 may provide the first read supply voltage VPPRD to the global bit line GBL, based on the precharge signal PCGB. The precharge circuit 711 may include a first transistor T71. The first transistor T71 may be a P-channel MOS transistor. The first transistor T71 may have a gate configured to receive the precharge signal PCGB, a source configured to receive the first read supply voltage VPPRD, and a drain coupled to the global bit line GBL.

The first current mirror 712 may include a first current source S71 configured to provide the first current ICLP. The first current mirror 712 may receive the read pulse signal RDP, provide the first read supply voltage VPPRD to the global bit line GBL based on the read pulse signal RDP, and mirror the first current ICLP provided by the first current source S71 such that the first current ICLP flows through the global bit line GBL. The first current mirror 712 may include the first current source S71, a second transistor T72, a third transistor T73 and a fourth transistor T74. The first current source S71 may have one end coupled to a supply voltage terminal having a random voltage level. The second to fourth transistors T72 to T74 may be P-channel MOS transistors. The second transistor T72 may have a gate configured to receive the read pulse signal RDP and a drain coupled to the global bit line GBL. The third transistor T73 may have a gate coupled to the other end of the first current source S71, a drain coupled to a source of the second transistor T72, and a source configured to receive the first read supply voltage VPPRD. The fourth transistor T74 may have a gate and drain coupled to the gate of the third transistor T73 in common and a source configured to receive the first read supply voltage VPPRD.

The anneal current circuit 642 may include a second current mirror 721. The second current mirror 721 may include a second current source S72 configured to provide the second current IANN. The second current mirror 721 may receive the first control signal BVC, provide the anneal high voltage VPPAN to the global bit line GBL based on the first control signal BVC, and mirror the second current IANN provided by the second current source S72 such that the second current IANN flows through the global bit line GBL. The second current mirror 721 may include the second current source S72, a fifth transistor T75, a sixth transistor T76 and a seventh transistor T77. The second current source S72 may have one end coupled to a supply voltage terminal having a random voltage level. The fifth to seventh transistors T75 to T77 may be P-channel MOS transistors. The fifth transistor T75 may have a gate configured to receive the first control signal BVC and a drain coupled to the global bit line GBL. The sixth transistor T76 may have a gate coupled to the other end of the second current source S72, a drain coupled to a source of the fifth transistor T75, and a source configured to receive the anneal high voltage VPPAN. The seventh transistor T77 may have a gate and drain coupled to the gate of the sixth transistor T76 in common and a source configured to receive the anneal high voltage VPPAN.

Figure 8A:
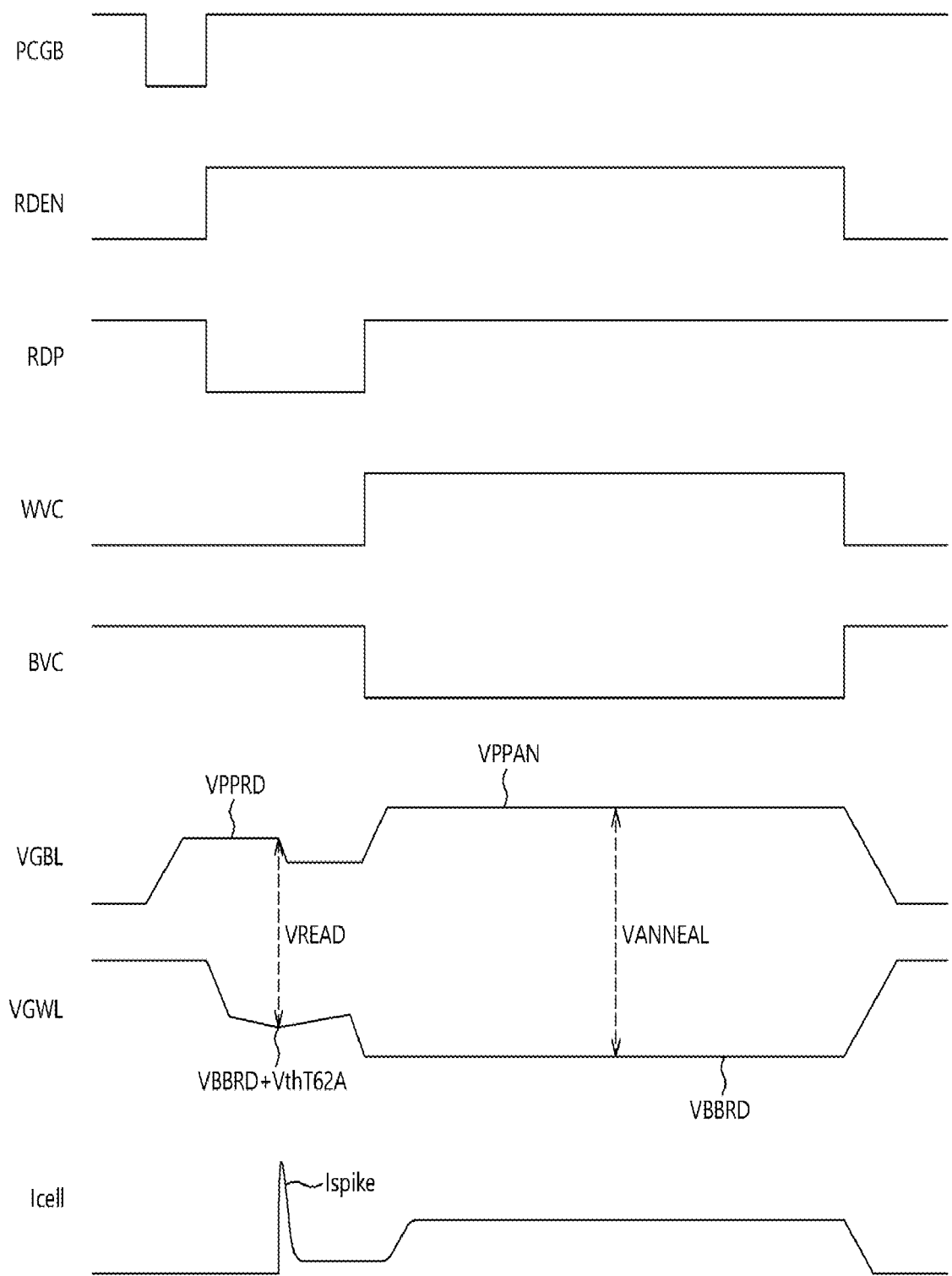
FIGS. 8A to 8C are timing diagrams illustrating operations of a nonvolatile memory apparatus in accordance with the embodiment.
Figure 8B:
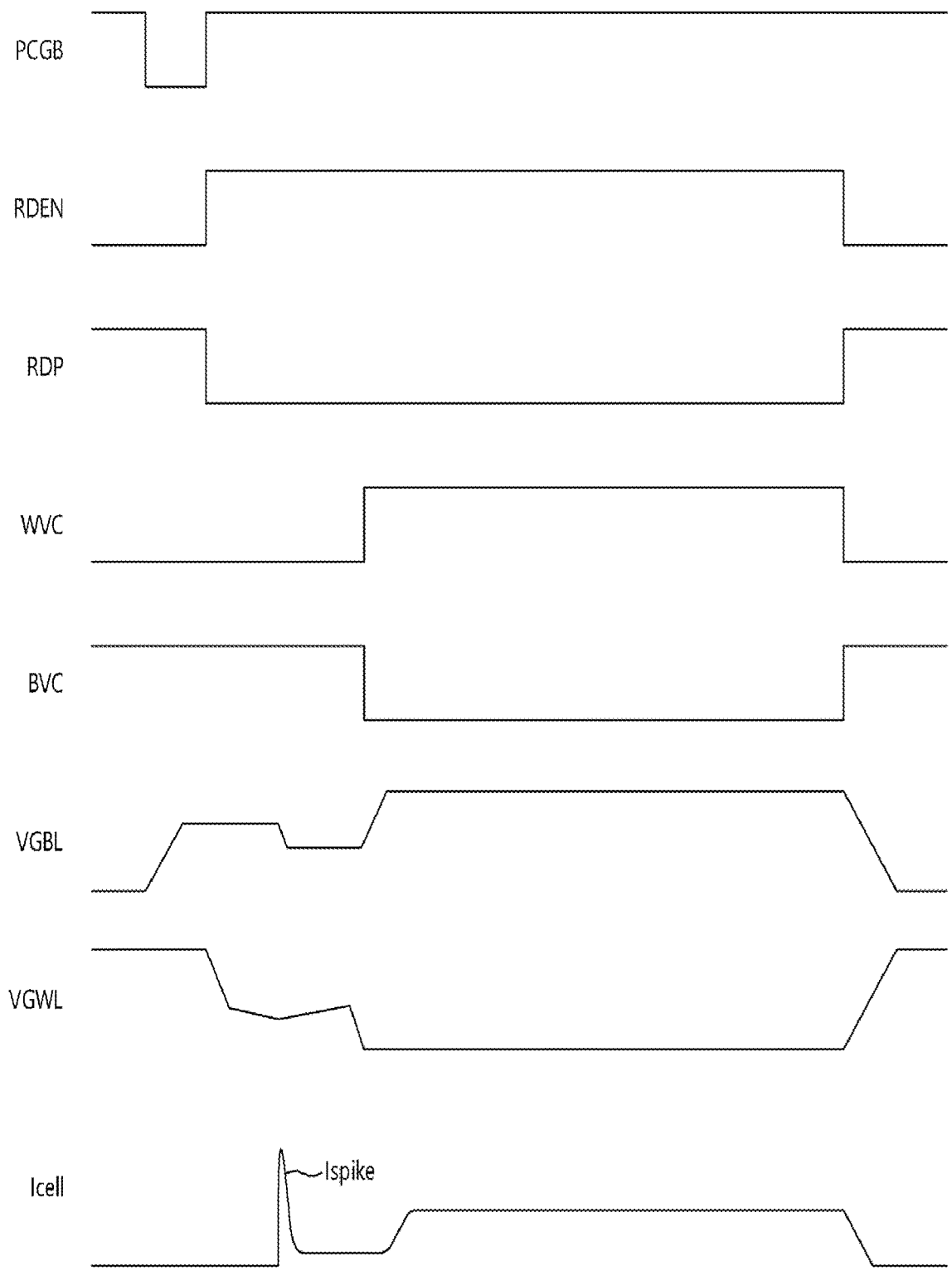
Figure 8C:
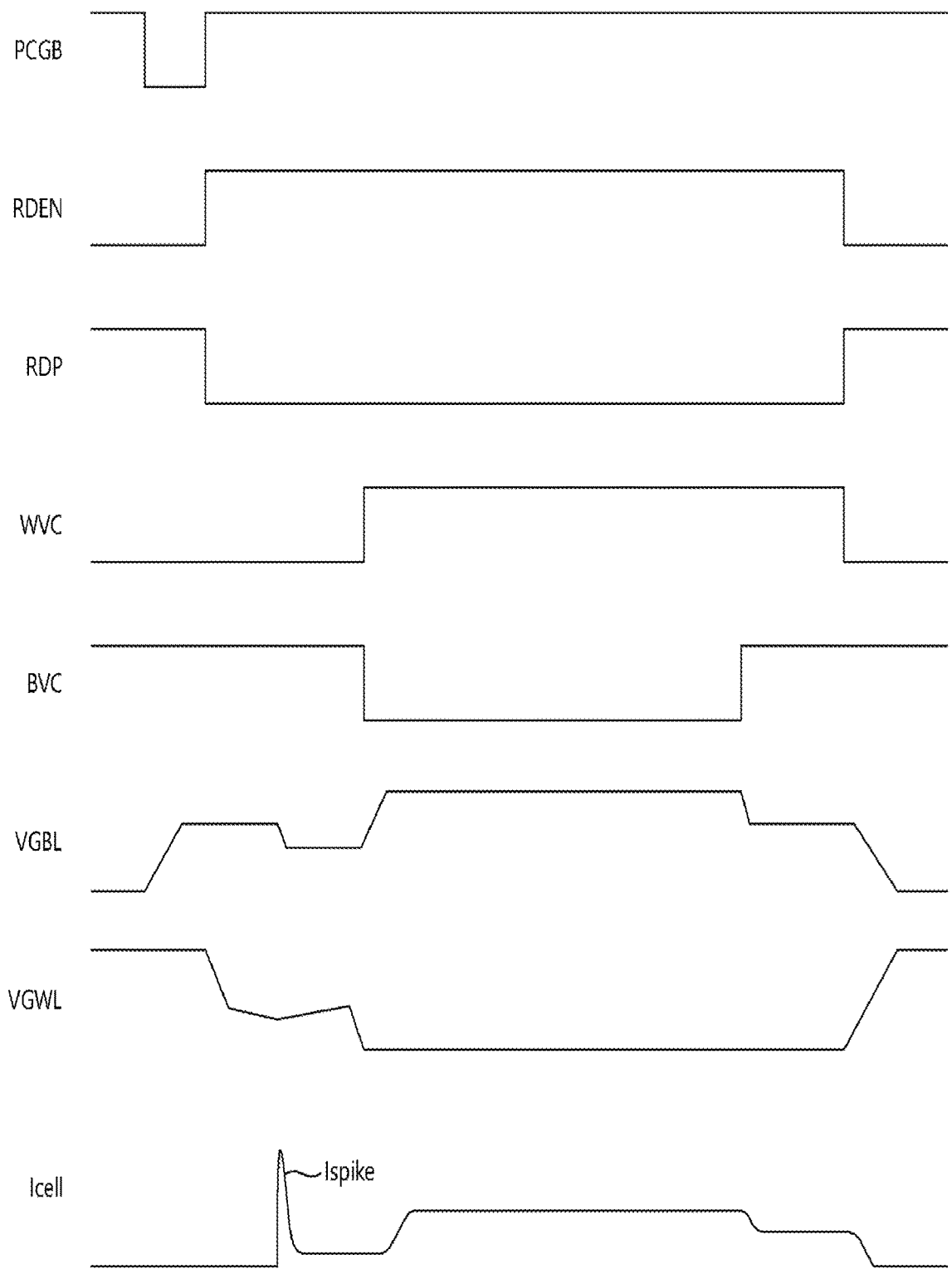

FIGS. 8A to 8C are timing diagrams illustrating operations of the nonvolatile memory apparatus in accordance with the embodiment. Referring to FIGS. 5, 6A, 7 and 8A, an operation of the nonvolatile memory apparatus 600A in accordance with the present embodiment will be described as follows. FIG. 8A illustrates pulses of the precharge signal PCGB, the read enable signal RDEN, the read pulse signal RDP, the first control signal BVC and the second control signal WVC, changes in the voltage level VGBL of the global bit line GBL and the voltage level VGWL of the global word line GWL, and a memory cell current Icell flowing through the memory cell 610. When the read operation of the nonvolatile memory apparatus 600A is performed, the column selection switch 622 may couple the bit line BL to the global bit line GBL based on the column selection signal YS, and the row selection switch 631 may couple the word line WL to the global word line GWL based on the row selection signal XS. At this time, the level shifter 621 may raise the voltage level of the column selection signal YS and provide the column selection signal YS having the raised voltage level to the column selection switch 622. When the read operation is performed, the precharge signal PCGB may be first enabled to a low level. Based on the precharge signal PCGB, the precharge circuit 711 may precharge the global bit line GBL with the voltage level of the first read supply voltage VPPRD corresponding to the first high voltage. Therefore, the voltage level VGBL of the global bit line may rise to the level of the first read supply voltage VPPRD.

The precharge signal PCGB may be disabled, the read enable signal RDEN may be enabled to a high level, and the read pulse signal RDP may be enabled to a low level. The read current circuit 641 may continuously provide the first read supply voltage VPPRD to the global bit line GBL based on the read pulse signal RDP, and control the first current ICLP to flow through the global bit line GBL. The read voltage supply circuit 651A may provide the second read supply voltage VBBRD to the global word line GWL, based on the read enable signal RDEN. At this time, the read voltage supply circuit 651A may clamp the voltage level of the second read supply voltage VBBRD, and provide the first low voltage VBBRD+VthT62A to the global word line GWL. When the voltage level VGWL of the global word line is sufficiently lowered to the voltage level of the first low voltage VBBRD+VthT62A, a voltage corresponding to a read voltage VREAD may be applied across the memory cell 610, and snapback of the memory cell in a low resistance state may occur. When the snapback of the memory cell 610 occurs, the resistance value of the memory cell 610 may rapidly decrease, and the memory cell current Icell which is a current flowing through the memory cell 610 may be rapidly increased to generate a spike current Ispike. When the snapback of the memory cell 610 occurs, the memory cell current Icell may be increased to lower the voltage level VGBL of the global bit line and to raise the voltage level VGWL of the global word line. The sense amplifier 660 may sense the change in voltage level of the global word line GWL, and enable the first and second control signals BVC and WVC.

The anneal current circuit 642 may provide the anneal high voltage VPPAN to the global bit line GBL based on the first control signal BVC, and control the second current IANN to flow through the global bit line GBL. A voltage level difference between the voltage level VGBL of the global bit line and the voltage level VGWL of the global word line may become an anneal voltage VANNEAL higher than the read voltage VREAD. As the second current IANN is controlled to flow through the global bit line GBL, the memory cell current Icell may become the second current IANN. The bypass circuit 652A may provide the second read supply voltage VBBRD to the global word line GWL based on the second control signal WVC, and the voltage level VGWL of the global word line may fall to a voltage level close to the voltage level of the second read supply voltage VBBRD. Therefore, as crystallization of the memory cell 610 progresses, the resistance state of the memory cell 610 may be set to a low resistance state. When the resistance state of the memory cell 610 is sufficiently set to the low resistance state, the read operation may be ended. Therefore, the read enable signal RDEN, the first control signal BVC and the second control signal WVC may be disabled, the voltage level VGBL of the global bit line may fall, and the voltage level VGWL of the global word line may rise.

The nonvolatile memory apparatus 600A in accordance with the present embodiment may include the level shifter 621 configured to raise the voltage level of the column selection signal YS and provide the column selection signal YS having the raised voltage level to the column selection switch 622. When the voltage level of the column selection signal YS is raised, the amount of current flowing through the column selection switch 622 may be decreased to reduce the amount of the spike current Ispike which is generated when snapback of the memory cell 610 occurs. When the spike current Ispike is reduced, it is possible to mitigate disturbance that the memory cell 610 in the low resistance state is changed to the high resistance state.

The nonvolatile memory apparatus 600A in accordance with the present embodiment may lower the voltage level of the column selection signal YS to reduce the spike current Ispike generated in case of snapback of the memory cell 610, thereby mitigating the disturbance caused by the spike current Ispike. Furthermore, as the nonvolatile memory apparatus 600A supplies a sufficient anneal current to the memory cell 610 after the occurrence of the snapback of the memory cell 610, the low resistance state of the memory cell 610 may be set enough to mitigate the disturbance.

FIG. 8B is a timing diagram illustrating another operation of the nonvolatile memory apparatus 600A. Referring to FIGS. 6A and 8B, the read pulse signal RDP may be continuously enabled during an interval in which the read enable signal RDEN is enabled. The read pulse signal RDP may be enabled substantially at the same time as the read enable signal RDEN, and disabled substantially at the same time as the read enable signal RDEN. The word line control circuit 650A may supply the first current ICLP to the memory cell 610 in response to the read pulse signal RDP, and additionally supply the second current IANN to the memory cell 610 such that the second current IANN overlaps the first current ICLP, when the second control signal WVC is enabled. When the read pulse signal RDP retains the enabled state even though the second control signal WVC is enabled, it is possible to reduce switching noise which occurs while the current supplied to the memory cell 610 is changed from the first current ICLP to the second current IANN. Therefore, the waveform of the anneal current applied to the memory cell may be further improved.

FIG. 8C is a timing diagram illustrating still another operation of the nonvolatile memory apparatus 600A. Referring to FIGS. 6A and 8C, the read pulse signal RDP may be continuously enabled during an interval in which the read enable signal RDEN is enabled, as illustrated in FIG. 8B. In an embodiment, the read pulse signal RDP may be disabled before the read enable signal RDEN, as illustrated in FIG. 8A. The control signal generation circuit 662 of the sense amplifier 660 may disable the first control signal BVC before the second control signal WVC. That is, the first control signal BVC may be disabled before the point of time that the read signal RD is disabled. When the first control signal BVC is first disabled, the voltage level VGBL of the global bit line may rise in a stepwise manner, before the voltage level VGWL of the global word line falls, as illustrated in FIG. 8C. The step of annealing and/or setting back the memory cell by applying the anneal current may include a nucleation step of forming a crystallization nucleus and a growth step of growing the crystallization nucleus. In addition, the step of annealing and/or setting back the memory cell by applying the anneal current may include a ramping-down step of ramping down the current flowing through the memory cell in a stepwise manner, when the crystallization nucleus is sufficiently grown. When the first control signal BVC is disabled before the second control signal WVC, the anneal current supplied to the memory cell 610 may be ramped down in a stepwise manner to easily implement the ramping-down step. Furthermore, the read operation time may be reduced to improve read latency and to additionally mitigate read disturbance.

Figure 9:
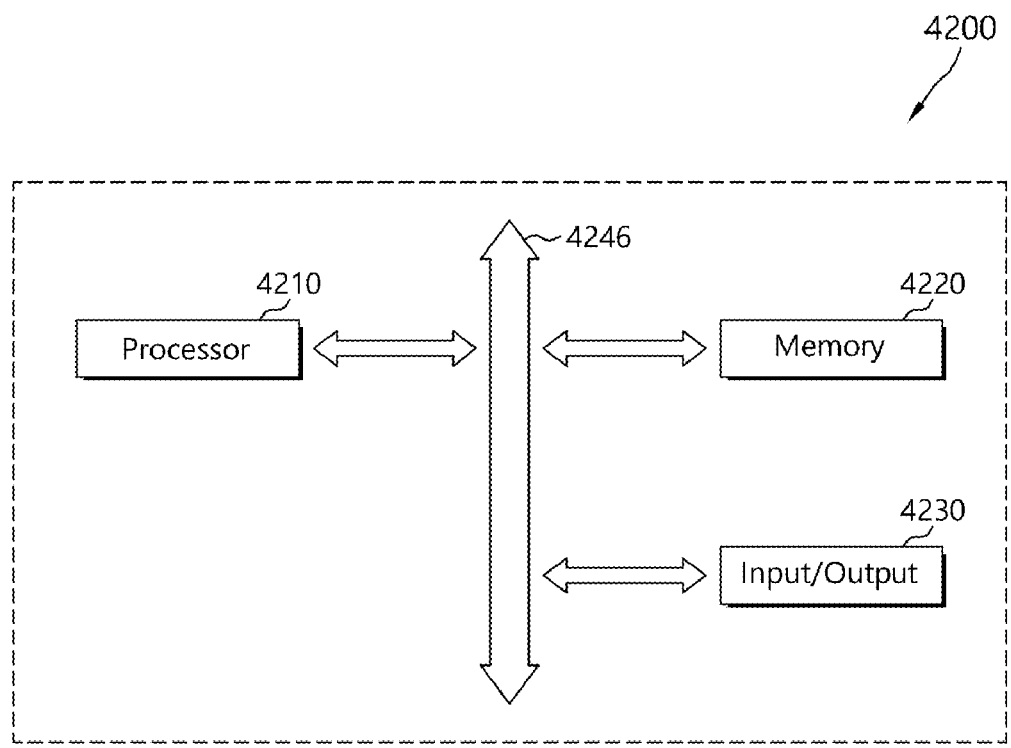
FIG. 9 illustrates a block diagram to assist in the explanation of an electronic apparatus including a semiconductor memory apparatus in accordance with an embodiment.

FIG. 9 illustrates a block diagram to assist in the explanation of an electronic apparatus including a semiconductor memory apparatuses in accordance with some embodiments. Referring to FIG. 9, an electronic apparatus 4200 may include a processor 4210, a memory 4220, and an input and output device 4230. The processor 4210, the memory 4220, and the input and output device 4230 may be coupled through a bus 4246.

The memory 4220 may receive a control signal from the processor 4210. The memory 4220 may store a code and data for the operation of the processor 4210. The memory 4220 may be used to store data to be accessed through the bus 4246. The memory 4220 may include at least one of the above described nonvolatile memory apparatuses 100, 200A, 200B, 500, 600A and 600B. In order for realization and modification, additional circuits and control signals may be provided.

The electronic apparatus 4200 may configure various electronic control apparatuses which use the memory 4220. For example, the electronic apparatus 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or any device capable of transmitting and receiving information under wireless circumstances.

Descriptions appear below for the realization and modified examples of the electronic apparatus 4200, with reference to FIGS. 10 and 11.

Figure 10:
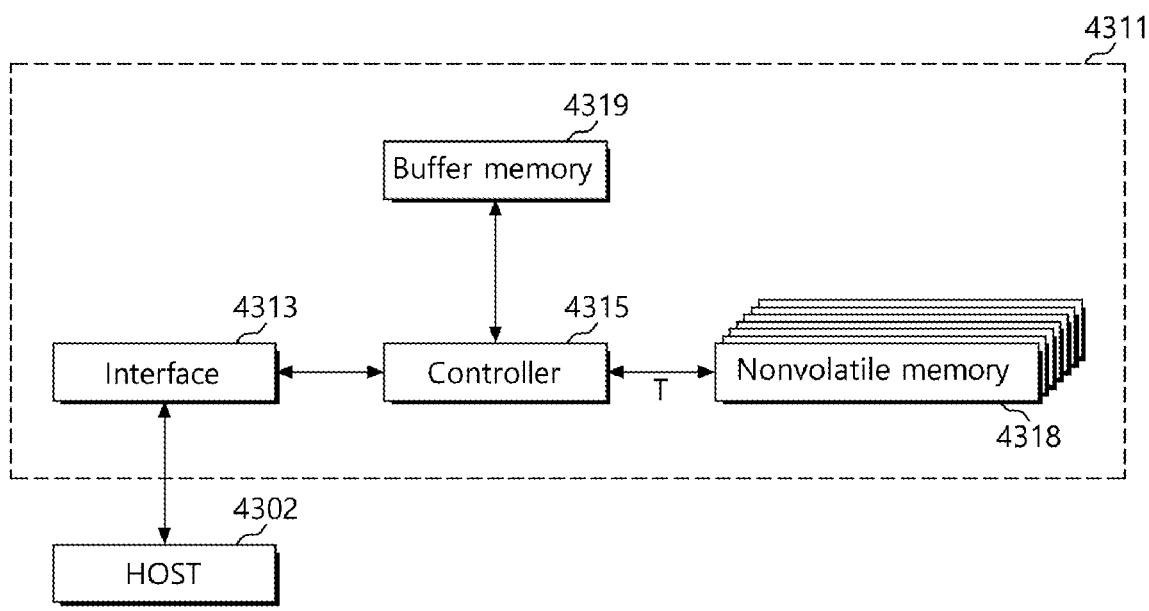
FIG. 10 illustrates a data storage device including a semiconductor memory apparatus in accordance with an embodiment.

FIG. 10 illustrates a data storage device including a semiconductor memory apparatuses in accordance with some embodiments. Referring to FIG. 10, a data storage device such as a solid state disk (SSD) 4311 may be provided. The solid state disk (SSD) 4311 may include an interface 4313, a controller 4315, nonvolatile memories 4318, and a buffer memory 4319.

The solid state disk 4311 is a device which stores information by using a semiconductor device. The solid state disk 4311 provides an advantage of high speed. Additionally, a mechanical delay, a failure rate, heat generation, and noise generation all decrease. Further, miniaturization and light weight may be realized as compared to a hard disk drive (HDD). The solid state disk 4311 may be widely used in a notebook PC, a net book, a desktop PC, an MP3 player, or a portable storage device.

The controller 4315 may be formed adjacent to the interface 4313 and be electrically coupled to the interface 4313. The controller 4315 may be a microprocessor including a memory controller and a buffer controller. The nonvolatile memories 4318 may be formed adjacent to the controller 4315 and be electrically coupled to the controller 4315 via connection terminals T. The data storage capacity of the solid state disk 4311 may correspond to the nonvolatile memories 4318. The buffer memory 4319 may be formed adjacent to the controller 4315 and be electrically coupled to the controller 4315. Each of the nonvolatile memories 4220 may include at least one of the nonvolatile memory apparatuses 100, 200A, 200b, 500, 600A, and 600b.

The interface 4313 may be coupled to a host 4302 and play the role of transmitting and receiving electrical signals such as data. For example, the interface 4313 may be a device which uses the same protocol as SATA, IDE, SCSI, and/or a combination thereof. The nonvolatile memories 4318 may be coupled to the interface 4313 via the controller 4315.

The nonvolatile memories 4318 may play the role of storing the data received through the interface 4313. The nonvolatile memories may include one of the above described nonvolatile memory apparatuses 100, 200A, 200b, 500, 600A, and 600b. The nonvolatile memories 4318 have a characteristic that the data stored therein are retained even though power supply to the solid state disk 4311 is cut off.

The buffer memory 4319 may include a volatile memory or a nonvolatile memory. The volatile memory may be a DRAM and/or an SRAM. The nonvolatile memory may include one of the above described nonvolatile memory apparatuses 100, 200A, 200b, 500, 600A, and 600b.

The data processing speed of the interface 4313 may be relatively faster when compared to the operation speed of the nonvolatile memories 4318. The buffer memory 4319 may play the role of temporarily storing data. The data received through the interface 4313 may be temporarily stored in the buffer memory 4319 via the controller 4315, and then, be permanently stored in the nonvolatile memories 4318 in conformity with the data recording speed of the nonvolatile memories 4318.

The data frequently used among the data stored in the nonvolatile memories 4318 may be read in advance and be temporarily stored in the buffer memory 4319. Namely, the buffer memory 4319 may play the role of increasing the effective operation speed and decreasing an error occurrence rate of the solid state disk 4311.

While various embodiments have been described above, it will be understood to those skilled in the art that the described embodiments serve as examples only. Accordingly, the nonvolatile memory apparatus and the operation method thereof, which have been described herein, should not be limited based on the described embodiments.

What is claimed is:

1. A nonvolatile memory apparatus comprising:
    a memory cell coupled between a global bit line and a global word line;
    a bit line control circuit configured to provide a first high voltage to the global bit line based on a read signal and to provide a second high voltage to the global bit line based on a first control signal;
    a word line control circuit configured to provide a first low voltage to the global word line based on the read signal and to provide a second low voltage to the global word line based on a second control signal, and configured to control a first current to flow through the global word line based on the read signal and to control a second current to flow through the global word line based on the second control signal; and
    a sense amplifier configured to sense snapback of the memory cell and generate the first and second control signals,
    wherein the second current is larger than the first current, and the second current comprises an amount of current capable of setting the resistance state of the memory cell to a low resistance state.

2. The nonvolatile memory apparatus according to claim 1, wherein the bit line control circuit provides the first high voltage to the global bit line based on the read signal, and provides the second high voltage having a higher voltage level than the first high voltage to the global bit line based on the first control signal.

3. The nonvolatile memory apparatus according to claim 1, wherein the bit line control circuit comprises:
    a read voltage supply circuit configured to generate the first high voltage by lowering the voltage level of a first read supply voltage, and supply the first high voltage to the global bit line, based on a clamping signal and a read enable signal generated from the read signal; and
    a bypass circuit configured to generate the second high voltage from the first read supply voltage, and supply the second high voltage to the global bit line, based on the first control signal.

4. The nonvolatile memory apparatus according to claim 1, wherein the bit line control circuit comprises:
    a read voltage supply circuit configured to generate the first high voltage by lowering the voltage level of a first read supply voltage, and supply the first high voltage to the global bit line, based on a clamping signal and a read enable signal generated from the read signal; and
    an anneal voltage supply circuit configured to generate the second high voltage from an anneal high voltage having a lower voltage level than the first read supply voltage, and supply the second high voltage to the global bit line, based on the first control signal.

5. The nonvolatile memory apparatus according to claim 1, wherein the word line control circuit provides the first low voltage to the global word line based on the read signal, and provides the second low voltage having a lower voltage level than the first low voltage to the global word line based on the second control signal.

6. The nonvolatile memory apparatus according to claim 1, wherein the word line control circuit controls the first current to flow through the global word line based on the read signal, and controls the second current to flow through the global word line based on the second control signal, wherein the second current is larger than the first current.

7. The nonvolatile memory apparatus according to claim 1, wherein the word line control circuit comprises:
    a read current circuit configured to supply a second read supply voltage as the first low voltage to the global word line, and control the first current to flow through the global word line, based on the read signal; and
    an anneal current circuit configured to supply an anneal low voltage, which has a lower voltage level than the second read supply voltage, as the second low voltage to the global word line, and control the second current to flow through the global word line, based on the second control signal.

8. The nonvolatile memory apparatus according to claim 7, wherein the read current circuit comprises:
    a precharge circuit configured to supply the second read supply voltage to the global word line based on a precharge signal; and
    a first current mirror comprising a first current source for supplying the first current, and configured to control the first current to flow through the global word line, when a read pulse signal generated from the read signal is enabled.

9. The nonvolatile memory apparatus according to claim 7, wherein the anneal current circuit comprises a second current mirror comprising a second current source for supplying the second current, and configured to control the second current to flow through the global word line when the second control signal is enabled.

10. The nonvolatile memory apparatus according to claim 1, wherein the sense amplifier generates the first and second control signals when the voltage level of the global word line is higher than the voltage level of a reference voltage.

11. The nonvolatile memory apparatus according to claim 1, wherein the sense amplifier disables the second control signal before disabling the first control signal.

12. The nonvolatile memory apparatus according to claim 1, wherein the memory cell is coupled between a bit line and a word line,
    wherein the nonvolatile memory apparatus further comprises:
    a column selection switch configured to couple the global bit line to the bit line based on a column selection signal;
    a voltage level shifter configured to lower the voltage level of a row selection signal; and
    a row selection switch configured to couple the global word line to the word line based on an output of the voltage level shifter.

13. An operation method of a nonvolatile memory apparatus, the method comprising:
    selecting a bit line to couple a memory cell to a global bit line, and selecting a word line to couple the memory cell to a global word line;
    applying a first high voltage to the global bit line and applying a first low voltage to the global word line, such that a first current flows through the memory cell, a voltage level difference between the first high voltage and the first low voltage corresponds to a voltage level of a read voltage;
    sensing whether snapback of the memory cell occurred; and applying a second high voltage to the global bit line and applying a second low voltage to the global word line, such that a second current flows through the memory cell, when the snapback of the memory cell occurred, wherein the second current is larger than the first current, and the second current comprises an amount of current capable of setting the resistance state of the memory cell to a low resistance state.

14. The operation method according to claim 13, wherein the second high voltage has a higher voltage level than the first high voltage.

15. The operation method according to claim 13, wherein the second low voltage has a lower voltage level than the first low voltage.

16. The operation method according to claim 13, wherein selecting the bit line to couple the memory cell to the global bit line comprises:
    generating a column selection signal based on a column address signal; and
    coupling the bit line to the global bit line based on the column selection signal.

17. The operation method according to claim 16, wherein selecting the word line to couple the memory cell to the global word line comprises:
    generating a row selection signal based on a row address signal;
    lowering the voltage level of the row selection signal; and
    coupling the word line to the global word line based on the row selection signal having the lowered voltage level.

18. The operation method according to claim 13, wherein selecting the bit line to couple the memory cell to the global bit line comprises:
    generating a column selection signal based on a column address signal;
    raising the voltage level of the column selection signal; and
    coupling the bit line to the global bit line based on the column selection signal having the raised voltage level.

19. The operation method according to claim 18, wherein selecting the word line to couple the memory cell to the global word line comprises:
    generating a row selection signal based on a row address signal; and
    coupling the word line to the global word line based on the row selection signal.

\* \* \* \* \*